United States Patent
Hirota et al.

(10) Patent No.: US 10,648,787 B2
(45) Date of Patent: May 12, 2020

(54) ROTATING FIELD SENSOR

(71) Applicant: TDK CORPORATION, Tokyo (JP)

(72) Inventors: Yohei Hirota, Tokyo (JP); Homare Tokida, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/454,284

(22) Filed: Jun. 27, 2019

(65) Prior Publication Data

US 2019/0316894 A1    Oct. 17, 2019

Related U.S. Application Data

(62) Division of application No. 14/309,742, filed on Jun. 19, 2014, now Pat. No. 10,386,169.

(30) Foreign Application Priority Data

Aug. 27, 2013  (JP) .................................. 2013-175900

(51) Int. Cl.
*G01B 7/30* (2006.01)
*G01D 5/14* (2006.01)
*G01R 33/09* (2006.01)

(52) U.S. Cl.
CPC .............. *G01B 7/30* (2013.01); *G01D 5/145* (2013.01); *G01R 33/093* (2013.01)

(58) Field of Classification Search
None
See application file for complete search history.

(56) References Cited

U.S. PATENT DOCUMENTS

| 8,093,886 B2 * | 1/2012 | Okada | G01D 5/145 324/207.12 |
| 8,589,105 B2 * | 11/2013 | Komasaki | G01D 5/145 324/207.21 |

(Continued)

FOREIGN PATENT DOCUMENTS

| JP | S61-173113 A | 8/1986 |
| JP | H04-5571 A | 1/1992 |

(Continued)

OTHER PUBLICATIONS

Jun. 24, 2015 Office Action issued in Japanese Patent Application No. 2013-175900.

(Continued)

*Primary Examiner* — John E Breene
*Assistant Examiner* — Brandon J Becker
(74) *Attorney, Agent, or Firm* — Oliff PLC

(57) ABSTRACT

A first, a second, and a third computing circuit respectively generate a first post-computation signal with a second harmonic component reduced as compared with first and second signals, a second post-computation signal with the second harmonic component reduced as compared with third and fourth signals, and a third post-computation signal with the second harmonic component reduced as compared with fifth and sixth signals. A fourth and a fifth computing circuit respectively generate a fourth post-computation signal with a third harmonic component reduced as compared with the first and second post-computation signals, and a fifth post-computation signal with the third harmonic component reduced as compared with the second and third post-computation signals. A sixth computing circuit determines a detected angle value based on the fourth and fifth post-computation signals.

5 Claims, 12 Drawing Sheets

(56) References Cited

U.S. PATENT DOCUMENTS

| | | |
|---|---|---|
| 8,736,256 B2 | 5/2014 | Komasaki et al. |
| 2002/0006017 A1 | 1/2002 | Adelerhof |
| 2005/0242802 A1 | 11/2005 | Matsumoto et al. |
| 2009/0206827 A1* | 8/2009 | Aimuta .................. G01D 5/145 324/207.25 |
| 2011/0031965 A1* | 2/2011 | Saruki .................. G01D 3/036 324/207.25 |
| 2011/0068780 A1 | 3/2011 | Sakai |
| 2012/0038348 A1* | 2/2012 | Aimuta .................. G01D 3/02 324/207.24 |
| 2012/0038351 A1* | 2/2012 | Saruki .................. G01R 33/091 324/207.25 |
| 2012/0038359 A1* | 2/2012 | Saruki .................. B82Y 25/00 324/252 |
| 2012/0053865 A1* | 3/2012 | Saruki .................. B82Y 25/00 702/57 |
| 2012/0058365 A1 | 3/2012 | Shimazaki |
| 2012/0095712 A1* | 4/2012 | Komasaki .............. G01D 3/036 702/94 |
| 2012/0119729 A1* | 5/2012 | Komasaki .............. B82Y 25/00 324/207.21 |
| 2012/0139533 A1* | 6/2012 | Manabe .................. G01D 5/2073 324/207.25 |
| 2012/0176126 A1 | 7/2012 | Naganuma et al. |
| 2012/0259573 A1* | 10/2012 | Mehnert ................. G01D 5/145 702/95 |

FOREIGN PATENT DOCUMENTS

| | | | |
|---|---|---|---|
| JP | H04-223218 A | | 8/1992 |
| JP | 2001-033277 A | | 2/2001 |
| JP | 2004-309366 A | | 11/2004 |
| JP | 2004309336 A | * | 11/2004 |
| JP | 2012-107963 A | | 6/2012 |
| JP | 2012-145425 A | | 8/2012 |
| WO | 2014/147996 A1 | | 9/2014 |

OTHER PUBLICATIONS

Jan. 13, 2016 Office Action issued in Japanese Patent Application No. 2013-175900.
U.S. Appl. No. 15/051,373, filed Feb. 23, 2016 in the name of Yohei Hirota et al.
Jan. 16, 2018 Office Action issued in U.S. Appl. No. 14/309,742.
Apr. 5, 2018 Office Action Issued in U.S. Appl. No. 14/309,742.
Sep. 20, 2018 Office Action issued in U.S. Appl. No. 14/309,742.
Mar. 7, 2019 Office Action issued in U.S. Appl. No. 15/051,373.
Sep. 6, 2019 Office Action Issued in U.S. Appl. No. 15/051,373.

* cited by examiner

ROTATING FIELD SENSOR

This is a divisional of application Ser. No. 14/309,742, filed Jun. 19, 2014, which claims priority from Japanese Patent Application No. 2013-175900, filed Aug. 27, 2013. The disclosure of the prior applications is hereby incorporated by reference herein in their entirety.

BACKGROUND OF THE INVENTION

1. Field of the Invention

The present invention relates to a rotating field sensor for detecting an angle that the direction of a rotating magnetic field forms with respect to a reference direction.

2. Description of the Related Art

In recent years, rotating field sensors have been widely used to detect the rotational position of an object in various applications such as detecting the rotational position of an automotive steering wheel. Systems using rotating field sensors are typically provided with means (for example, a magnet) for generating a rotating magnetic field whose direction rotates in response to the rotation of the object. The rotating field sensors use magnetic detection elements to detect the angle that the direction of the rotating magnetic field forms with respect to a reference direction. The rotational position of the object is thus detected.

Among known rotating field sensors is one that includes two bridge circuits (Wheatstone bridge circuits), as described in U.S. Patent Application Publication Nos. 2012/0053865 A1 and 2002/0006017 A1. In such a rotating field sensor, each of the two bridge circuits includes four magnetoresistive (MR) elements serving as magnetic detection elements, and outputs a signal responsive to the direction of the rotating magnetic field. The output signals of the two bridge circuits are different in phase from each other by ¼ the period of the output signals of the bridge circuits. The angle that the direction of the rotating magnetic field forms with respect to a reference direction is determined based on the output signals of the two bridge circuits.

JP S61-173113A discloses a magnetic rotation sensor including two sets of three sensing sections. In this sensor, the three sensing sections in each set are placed in parallel to each other and connected in series such that the spacing between every adjacent sensing sections is ⅓ the write wavelength of a signal magnetic field. A power supply voltage is applied across each set of three sensing sections, and signals are output from two junctions of the three sensing sections in each set. The two sets of three sensing sections are formed on one substrate such that corresponding sensing sections in the two sets are parallel to each other with a spacing therebetween of ½ the write wavelength of the signal magnetic field.

JP H04-005571A discloses a rotating direction discriminating and rotation detecting device including three magnetoresistive elements and two differential operational amplifiers. In this device, two of the three magnetoresistive elements have respective outputs connected to first inputs of the two differential operational amplifiers, and the remaining one of the magnetoresistive elements has an output connected to second inputs of the two differential operational amplifiers in common.

U.S. Patent Application Publication No. 2005/0242802 A1 discloses an angular speed detecting device including three Hall elements which output three output signals different in phase from each other by 90°.

In a rotating field sensor including bridge circuits that use MR elements as magnetic detection elements, ideally, the output signal waveform of each bridge circuit should trace a sinusoidal curve (including a sine waveform and a cosine waveform) as the direction of the rotating magnetic field rotates. As described in U.S. Patent Application Publication No. 2012/0053865 A1, however, the output signal waveform of each bridge circuit is known to be sometimes distorted from a sinusoidal curve. A distortion of the output signal waveform of each bridge circuit may lead to some error in the angle detected by the rotating field sensor. One of the factors that may distort the output signal waveform of each bridge circuit is the MR elements.

The following will describe examples of situations where the output signal waveform of a bridge circuit that uses MR elements is distorted due to the MR elements. Here, assume that the MR elements are giant magnetoresistive (GMR) elements or tunneling magnetoresistive (TMR) elements. GMR and TMR elements each include a magnetization pinned layer whose magnetization direction is pinned, a free layer whose magnetization direction varies depending on the direction of the rotating magnetic field, and a nonmagnetic layer disposed between the magnetization pinned layer and the free layer. One example of the situations where the output signal waveform of the bridge circuit is distorted due to the MR elements is where the magnetization direction of the magnetization pinned layer varies under the influence of the rotating magnetic field or like factors. This is likely to occur when the rotating magnetic field is relatively high in strength. Another example of the situations where the output signal waveform of the bridge circuit is distorted due to the MR elements is where the magnetization direction of the free layer differs from the direction of the rotating magnetic field due to effects such as the shape anisotropy and coercivity of the free layer. This is likely to occur when the rotating magnetic field is relatively low in strength.

Assume here that the output signal of the bridge circuit contains an ideal component which varies periodically in such a manner as to trace an ideal sinusoidal curve, and a signal error which distorts the output signal waveform of the bridge circuit. The signal error is composed mainly of a second harmonic component having a period of ½ the period of the ideal component, and a third harmonic component having a period of ⅓ the period of the ideal component. To reduce an error in the angle detected by the rotating field sensor, it is thus important to reduce the second harmonic component and the third harmonic component.

U.S. Patent Application Publication No. 2012/0053865 A1 discloses a technique for reducing the third harmonic component by providing four detection circuits each of which includes a Wheatstone bridge circuit and performing computations using the output signals of the four detection circuits. This technique, however, requires twice as many Wheatstone bridge circuits as the conventional rotating field sensor which uses two Wheatstone bridge circuits. The aforementioned technique thus has room for improvement in terms of downsizing and structure simplification of the rotating field sensor.

U.S. Patent Application Publication No. 2002/0006017 A1 discloses a technique for correcting a detected angle by establishing electrical connection between a main sensing element having a main reference magnetization axis and two correction sensing elements each having a reference magnetization axis inclined with respect to the main reference magnetization axis. This technique, however, requires that the design of the correction sensing elements be optimized according to the design conditions such as the resistances, sizes and materials of the main sensing element and the correction sensing elements and the strength of the rotating magnetic field, and thus has a drawback that the design of the sensor is not easy.

None of JP S61-173113A, JP H04-005571A and U.S. Patent Application Publication No. 2005/0242802 A1 particularly address reducing the third harmonic component.

As has been described, a rotating field sensor that uses MR elements as magnetic detection elements has a problem that the angle detected by the rotating field sensor may contain some error. This problem can occur in any rotating field sensor that includes magnetic detection elements to detect an angle that the direction of a rotating magnetic field forms with respect to a reference direction.

OBJECT AND SUMMARY OF THE INVENTION

It is an object of the present invention to provide a rotating field sensor for detecting an angle that the direction of a rotating magnetic field forms with respect to a reference direction, the rotating field sensor being capable of reducing an error in the detected angle.

Rotating field sensors of first and second aspects of the present invention are each configured to detect an angle that the direction of a rotating magnetic field in a reference position forms with respect to a reference direction. The rotating field sensors each include: first to sixth signal generation units configured to generate first to sixth signals, respectively, each of the first to sixth signals being responsive to the direction of the rotating magnetic field, each of the first to sixth signal generation units including at least one magnetic detection element; and an angle detection unit configured to generate a detected angle value based on the first to sixth signals, the detected angle value having a correspondence relationship with the angle that the direction of the rotating magnetic field in the reference position forms with respect to the reference direction. Each of the first to sixth signals contains: an ideal component that varies periodically with a predetermined signal period; an error component of a period of ½ the predetermined signal period; and an error component of a period of ⅓ the predetermined signal period. The ideal components of the first to sixth signals are different in phase from each other. The absolute value of the phase difference between the ideal component of the first signal and the ideal component of the second signal, the absolute value of the phase difference between the ideal component of the third signal and the ideal component of the fourth signal, and the absolute value of the phase difference between the ideal component of the fifth signal and the ideal component of the sixth signal are all greater than 150° and smaller than 210°.

In the rotating field sensor of the first aspect of the present invention, the angle detection unit includes first to sixth computing circuits. The first computing circuit generates a first post-computation signal based on the first and second signals, the first post-computation signal containing a reduced error component of the period of ½ the predetermined signal period as compared with the first and second signals. The second computing circuit generates a second post-computation signal based on the third and fourth signals, the second post-computation signal containing a reduced error component of the period of ½ the predetermined signal period as compared with the third and fourth signals. The third computing circuit generates a third post-computation signal based on the fifth and sixth signals, the third post-computation signal containing a reduced error component of the period of ½ the predetermined signal period as compared with the fifth and sixth signals. The fourth computing circuit generates a fourth post-computation signal based on the first and second post-computation signals, the fourth post-computation signal containing a reduced error component of the period of ⅓ the predetermined signal period as compared with the first and second post-computation signals. The fifth computing circuit generates a fifth post-computation signal based on the second and third post-computation signals, the fifth post-computation signal containing a reduced error component of the period of ⅓ the predetermined signal period as compared with the second and third post-computation signals. The sixth computing circuit determines the detected angle value based on the fourth and fifth post-computation signals.

In the rotating field sensor of the second aspect of the present invention, the angle detection unit includes first to seventh computing circuits. The first computing circuit generates a first post-computation signal based on the first and third signals, the first post-computation signal containing a reduced error component of the period of ⅓ the predetermined signal period as compared with the first and third signals. The second computing circuit generates a second post-computation signal based on the second and fourth signals, the second post-computation signal containing a reduced error component of the period of ⅓ the predetermined signal period as compared with the second and fourth signals. The third computing circuit generates a third post-computation signal based on the third and fifth signals, the third post-computation signal containing a reduced error component of the period of ⅓ the predetermined signal period as compared with the third and fifth signals. The fourth computing circuit generates a fourth post-computation signal based on the fourth and sixth signals, the fourth post-computation signal containing a reduced error component of the period of ⅓ the predetermined signal period as compared with the fourth and sixth signals. The fifth computing circuit generates a fifth post-computation signal based on the first and second post-computation signals, the fifth post-computation signal containing a reduced error component of the period of ½ the predetermined signal period as compared with the first and second post-computation signals. The sixth computing circuit generates a sixth post-computation signal based on the third and fourth post-computation signals, the sixth post-computation signal containing a reduced error component of the period of ½ the predetermined signal period as compared with the third and fourth post-computation signals. The seventh computing circuit determines the detected angle value based on the fifth and sixth post-computation signals.

Let PH1 be the absolute value of the phase difference between the ideal component of the first signal and the ideal component of the third signal. Let PH2 be the absolute value of the phase difference between the ideal component of the third signal and the ideal component of the fifth signal. Let PH3 be the absolute value of the phase difference between the ideal component of the second signal and the ideal component of the fourth signal. Let PH4 be the absolute value of the phase difference between the ideal component of the fourth signal and the ideal component of the sixth signal.

In the rotating field sensor of the first aspect of the present invention, PH1, PH2, PH3, and PH4 may all be greater than 40° and smaller than 80°. In such a case, the absolute value of the phase difference between the ideal component of the first signal and the ideal component of the fifth signal is PH1+PH2, and the absolute value of the phase difference between the ideal component of the second signal and the ideal component of the sixth signal is PH3+PH4. Further, in this case, the first post-computation signal may be generated by computation including determining a difference between the first signal and the second signal. The second post-computation signal may be generated by computation including determining a difference between the third signal and the fourth signal. The third post-computation signal may be generated by computation including determining a difference between the fifth signal and the sixth signal. The fourth post-computation signal may be generated by computation including determining the sum of the first post-computation signal and the second post-computation signal. The fifth post-computation signal may be generated by computation including determining the sum of the second post-computation signal and the third post-computation signal.

Alternatively, in the rotating field sensor of the first aspect of the present invention, PH1, PH2, PH3, and PH4 may all be greater than 100° and smaller than 140°. In such a case, the absolute value of the phase difference between the ideal component of the first signal and the ideal component of the fifth signal is PH1+PH2, and the absolute value of the phase difference between the ideal component of the second signal and the ideal component of the sixth signal is PH3+PH4. Further, in this case, the first post-computation signal may be generated by computation including determining the difference between the first signal and the second signal. The second post-computation signal may be generated by computation including determining the difference between the third signal and the fourth signal. The third post-computation signal may be generated by computation including determining the difference between the fifth signal and the sixth signal. The fourth post-computation signal may be generated by computation including determining a difference between the first post-computation signal and the second post-computation signal. The fifth post-computation signal may be generated by computation including determining a difference between the second post-computation signal and the third post-computation signal.

In the rotating field sensor of the second aspect of the present invention, PH1, PH2, PH3, and PH4 may all be greater than 40° and smaller than 80°. In such a case, the absolute value of the phase difference between the ideal component of the first signal and the ideal component of the fifth signal is PH1+PH2, and the absolute value of the phase difference between the ideal component of the second signal and the ideal component of the sixth signal is PH3+PH4. Further, in this case, the first post-computation signal may be generated by computation including determining the sum of the first signal and the third signal. The second post-computation signal may be generated by computation including determining the sum of the second signal and the fourth signal. The third post-computation signal may be generated by computation including determining the sum of the third signal and the fifth signal. The fourth post-computation signal may be generated by computation including determining the sum of the fourth signal and the sixth signal. The fifth post-computation signal may be generated by computation including determining the difference between the first post-computation signal and the second post-computation signal. The sixth post-computation signal may be generated by computation including determining a difference between the third post-computation signal and the fourth post-computation signal.

Alternatively, in the rotating field sensor of the second aspect of the present invention, PH1, PH2, PH3, and PH4 may all be greater than 100° and smaller than 140°. In such a case, the absolute value of the phase difference between the ideal component of the first signal and the ideal component of the fifth signal is PH1+PH2, and the absolute value of the phase difference between the ideal component of the second signal and the ideal component of the sixth signal is PH3+PH4. Further, in this case, the first post-computation signal may be generated by computation including determining a difference between the first signal and the third signal. The second post-computation signal may be generated by computation including determining a difference between the second signal and the fourth signal. The third post-computation signal may be generated by computation including determining a difference between the third signal and the fifth signal. The fourth post-computation signal may be generated by computation including determining a difference between the fourth signal and the sixth signal. The fifth post-computation signal may be generated by computation including determining the difference between the first post-computation signal and the second post-computation signal. The sixth post-computation signal may be generated by computation including determining the difference between the third post-computation signal and the fourth post-computation signal.

In the rotating field sensors of the first and second aspects of the present invention, the at least one magnetic detection element may be at least one magnetoresistive element including: a magnetization pinned layer whose magnetization direction is pinned; a free layer whose magnetization direction varies depending on the direction of the rotating magnetic field; and a nonmagnetic layer disposed between the magnetization pinned layer and the free layer.

In the rotating field sensors of the first and second aspects of the present invention, each of the first to sixth signal generation units may include, as the at least one magnetic detection element, a first magnetoresistive element and a second magnetoresistive element connected in series. Each of the first and second magnetoresistive elements may include: a magnetization pinned layer whose magnetization direction is pinned; a free layer whose magnetization direction varies depending on the direction of the rotating magnetic field; and a nonmagnetic layer disposed between the magnetization pinned layer and the free layer. In such a case, the magnetization direction of the magnetization pinned layer of the first magnetoresistive element and the magnetization direction of the magnetization pinned layer of the second magnetoresistive element are opposite to each other. Further, in this case, the first and second magnetoresistive elements are configured so that a predetermined voltage is applied between an end of the first magnetoresistive element and an end of the second magnetoresistive element farther from each other, and each of the first to sixth signals is output from a junction between the first and second magnetoresistive elements in a corresponding one of the first to sixth signal generation units.

In the rotating field sensor of the first aspect of the present invention, generated are the first post-computation signal containing a reduced error component of the period of ½ the predetermined signal period as compared with the first and second signals, the second post-computation signal containing a reduced error component of the period of ½ the predetermined signal period as compared with the third and fourth signals, and the third post-computation signal containing a reduced error component of the period of ½ the predetermined signal period as compared with the fifth and sixth signals. Based on the first and second post-computation signals, generated is the fourth post-computation signal containing a reduced error component of the period of ⅓ the predetermined signal period as compared with the first and second post-computation signals. Based on the second and third post-computation signals, generated is the fifth post-computation signal containing a reduced error component of the period of ⅓ the predetermined signal period as compared with the second and third post-computation signals. Based on the fourth and fifth post-computation signals, the detected angle value is determined. The present invention thereby makes it possible to reduce an error in the angle detected by the rotating field sensor.

In the rotating field sensor of the second aspect of the present invention, generated are the first post-computation signal containing a reduced error component of the period of ⅓ the predetermined signal period as compared with the first and third signals, the second post-computation signal containing a reduced error component of the period of ⅓ the predetermined signal period as compared with the second and fourth signals, the third post-computation signal containing a reduced error component of the period of ⅓ the predetermined signal period as compared with the third and fifth signals, and the fourth post-computation signal containing a reduced error component of the period of ⅓ the predetermined signal period as compared with the fourth and sixth signals. Based on the first and second post-computation signals, generated is the fifth post-computation signal containing a reduced error component of the period of ½ the predetermined signal period as compared with the first and second post-computation signals. Based on the third and fourth post-computation signals, generated is the sixth post-computation signal containing a reduced error component of the period of ½ the predetermined signal period as compared with the third and fourth post-computation signals. Based on the fifth and sixth post-computation signals, the detected angle value is determined. The present invention thereby makes it possible to reduce an error in the angle detected by the rotating field sensor.

Other and further objects, features and advantages of the present invention will appear more fully from the following description.

DETAILED DESCRIPTION OF THE PREFERRED EMBODIMENTS

First Embodiment

Figure 1:
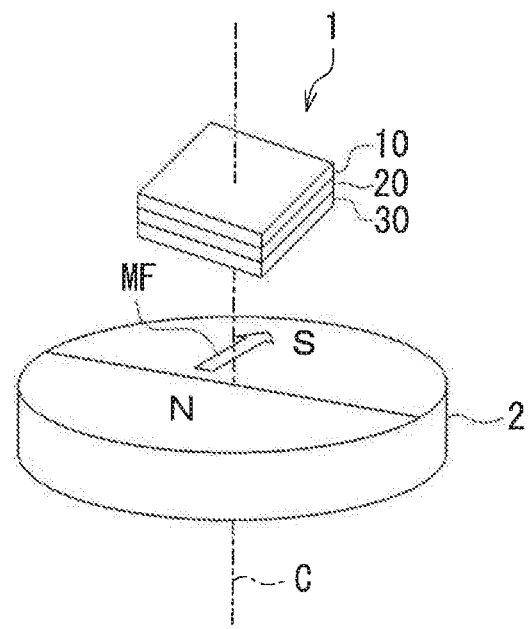
FIG. 1 is a perspective view illustrating the general configuration of a rotating field sensor according to a first embodiment of the invention.
Figure 2:
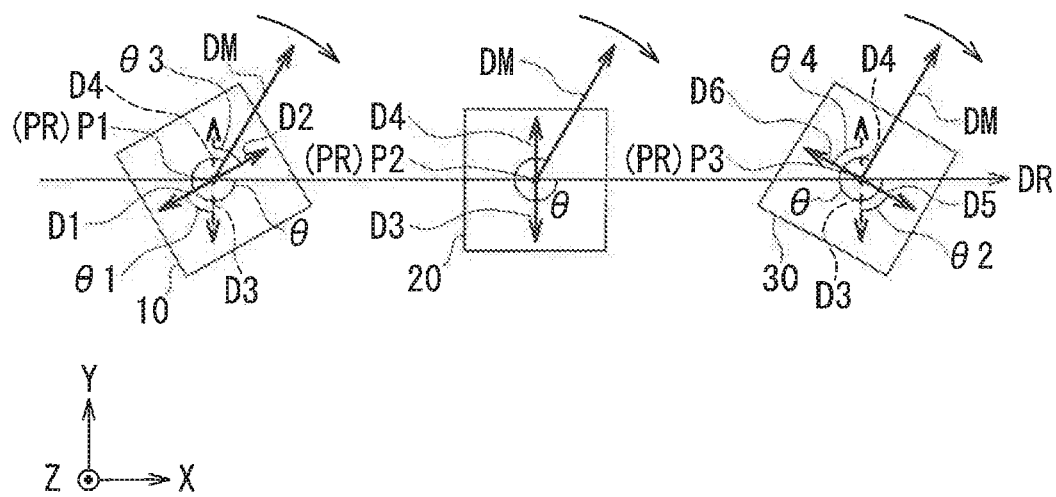
FIG. 2 is an explanatory diagram illustrating the definitions of directions and angles used in the first embodiment of the invention.

Preferred embodiments of the present invention will now be described in detail with reference to the drawings. First, reference is made to FIG. 1 and FIG. 2 to describe the general configuration of a rotating field sensor according to a first embodiment of the invention. FIG. 1 is a perspective view illustrating the general configuration of the rotating field sensor according to the first embodiment. FIG. 2 is an explanatory diagram illustrating the definitions of directions and angles used in the first embodiment.

As shown in FIG. 1, the rotating field sensor 1 according to the first embodiment is configured to detect the angle that the direction of a rotating magnetic field MF in a reference position forms with respect to a reference direction. The direction of the rotating magnetic field MF in the reference position rotates when viewed from the rotating field sensor 1. In FIG. 1, a cylindrical magnet 2 is shown as an example of means for generating the rotating magnetic field MF. The magnet 2 has an N pole and an S pole that are arranged symmetrically with respect to a virtual plane including the central axis of the cylinder. The magnet 2 rotates about the central axis of the cylinder. Consequently, the direction of the rotating magnetic field MF generated by the magnet 2 rotates about a center of rotation C including the central axis of the cylinder.

The reference position is located within a virtual plane parallel to an end face of the magnet 2. This virtual plane will hereinafter be referred to as the reference plane. In the reference plane, the direction of the rotating magnetic field MF generated by the magnet 2 rotates about the reference position. The reference direction is located within the reference plane and intersects the reference position. In the following description, the direction of the rotating magnetic field MF in the reference position refers to a direction located within the reference plane. The rotating field sensor 1 is disposed to face the aforementioned end face of the magnet 2. As will be described later in relation to other embodiments, the means for generating the rotating magnetic field MF is not limited to the magnet 2 shown in FIG. 1.

The rotating field sensor 1 includes a first detection circuit 10, a second detection circuit 20, and a third detection circuit 30. To facilitate understanding, FIG. 1 depicts the first to third detection circuits 10, 20 and 30 as separate components. However, the first to third detection circuits 10, 20 and 30 may be integrated into a single component. Further, while in FIG. 1 the first to third detection circuits 10, 20 and 30 are stacked in a direction parallel to the center of rotation C, the order of stacking is not limited to the example shown in FIG. 1.

Definitions of directions and angles used in the first embodiment will now be described with reference to FIG. 1 and FIG. 2. First, the direction parallel to the center of rotation C shown in FIG. 1 and from bottom to top in FIG. 1 is defined as the Z direction. In FIG. 2, the Z direction is shown as the direction out of the plane of FIG. 2. Next, two directions that are perpendicular to the Z direction and orthogonal to each other are defined as the X direction and the Y direction. In FIG. 2, the X direction is shown as the rightward direction, and the Y direction is shown as the upward direction. Further, the direction opposite to the X direction is defined as the −X direction, and the direction opposite to the Y direction is defined as the −Y direction.

The reference position PR is the position where the rotating field sensor 1 detects the rotating magnetic field MF. For example, the reference position PR shall be where the first detection unit 10 is located. The reference direction DR shall be the X direction. The angle that the direction DM of the rotating magnetic field MF in the reference position PR forms with respect to the reference direction DR will be designated by symbol θ. The direction DM of the rotating magnetic field MF shall rotate clockwise in FIG. 2. The angle θ will be expressed in a positive value when seen clockwise from the reference direction DR, and in a negative value when seen counterclockwise from the reference direction DR.

The position where the first detection circuit 10 is located will be referred to as the first position P1, the position where the second detection circuit 20 is located will be referred to as the second position P2, and the position where the third detection circuit 30 is located will be referred to as the third position P3. In the first embodiment, the first to third positions P1, P2 and P3 are the same in the direction of rotation of the rotating magnetic field MF, and identical with the reference position PR.

The first detection circuit 10 includes a first signal generation unit and a second signal generation unit. The second detection circuit 20 includes a third signal generation unit and a fourth signal generation unit. The third detection circuit 30 includes a fifth signal generation unit and a sixth signal generation unit. Each of the first to sixth signal generation units includes at least one magnetic detection element. The configurations of the first to sixth signal generation units will be described in detail later.

The first to sixth signal generation units generate first to sixth signals, respectively, each of the first to sixth signals being responsive to the direction DM of the rotating magnetic field MF. More specifically, the first signal generation unit generates a first signal corresponding to the relative angle between the direction DM of the rotating magnetic field MF and a first direction D1. The first signal is maximum when the direction DM of the rotating magnetic field MF coincides with the first direction D1. The second signal generation unit generates a second signal corresponding to the relative angle between the direction DM of the rotating magnetic field MF and a second direction D2. The second signal is maximum when the direction DM of the rotating magnetic field MF coincides with the second direction D2. The third signal generation unit generates a third signal corresponding to the relative angle between the direction DM of the rotating magnetic field MF and a third direction D3. The third signal is maximum when the direction DM of the rotating magnetic field MF coincides with the third direction D3. The fourth signal generation unit generates a fourth signal corresponding to the relative angle between the direction DM of the rotating magnetic field MF and a fourth direction D4. The fourth signal is maximum when the direction DM of the rotating magnetic field MF coincides with the fourth direction D4. The fifth signal generation unit generates a fifth signal corresponding to the relative angle between the direction DM of the rotating magnetic field MF and a fifth direction D5. The fifth signal is maximum when the direction DM of the rotating magnetic field MF coincides with the fifth direction D5. The sixth signal generation unit generates a sixth signal corresponding to the relative angle between the direction DM of the rotating magnetic field MF and a sixth direction D6. The sixth signal is maximum when the direction DM of the rotating magnetic field MF coincides with the sixth direction D6.

The angle between the first direction D1 and the second direction D2, the angle between the third direction D3 and the fourth direction D4, and the angle between the fifth direction D5 and the sixth direction D6 are all greater than 150° and smaller than 210°. All of these angles are preferably 180° as shown in FIG. 2. The following description will mainly discuss the case where these angles are all 180°.

In the first embodiment, the third direction D3 is the −Y direction, that is, the direction rotated clockwise by 90° from the reference direction DR. Here, let θ1 be the absolute value of the angle between the first direction D1 and the third direction D3, and let θ2 be the absolute value of the angle between the third direction D3 and the fifth direction D5. The first direction D1 is the direction rotated clockwise by θ1 from the third direction D3. The fifth direction D5 is the direction rotated counterclockwise by θ2 from the third direction D3. The absolute value of the angle between the first direction D1 and the fifth direction D5 is θ1+θ2.

Further, in the first embodiment, the fourth direction D4 is the Y direction, that is, the direction rotated counterclockwise by 90° from the reference direction DR. Here, let θ3 be the absolute value of the angle between the second direction D2 and the fourth direction D4, and let θ4 be the absolute value of the angle between the fourth direction D4 and the sixth direction D6. The second direction D2 is the direction rotated clockwise by θ3 from the fourth direction D4. The sixth direction D6 is the direction rotated counterclockwise by θ4 from the fourth direction D4. The absolute value of the angle between the second direction D2 and the sixth direction D6 is θ3+θ4.

In the first embodiment, θ1 to θ4 are all greater than 40° and smaller than 80°. All of θ1 to θ4 are preferably 60° as shown in FIG. 2. The following description will mainly discuss the case where θ1 to θ4 are all 60°. In this case, θ1+θ2 and θ3+θ4 are both 120°.

Each of the first to sixth signals contains an ideal component that varies periodically with a predetermined signal period T. The ideal components of the first to sixth signals are different in phase from each other. The absolute value of the phase difference between the ideal component of the first signal and the ideal component of the second signal, the absolute value of the phase difference between the ideal component of the third signal and the ideal component of the fourth signal, and the absolute value of the phase difference between the ideal component of the fifth signal and the ideal component of the sixth signal are all greater than 150° and smaller than 210°. All of these phase differences preferably have an absolute value of 180°. The following description will mainly discuss the case where all of these phase differences have an absolute value of 180°.

Let PH1 be the absolute value of the phase difference between the ideal component of the first signal and the ideal component of the third signal. Let PH2 be the absolute value of the phase difference between the ideal component of the third signal and the ideal component of the fifth signal. Let PH3 be the absolute value of the phase difference between the ideal component of the second signal and the ideal component of the fourth signal. Let PH4 be the absolute value of the phase difference between the ideal component of the fourth signal and the ideal component of the sixth signal. PH1, PH2, PH3 and PH4 are all greater than 40° and smaller than 80°. PH1, PH2, PH3 and PH4 are all preferably 60°. The following description will mainly discuss the case where PH1, PH2, PH3 and PH4 are all 60°.

The absolute value of the phase difference between the ideal component of the first signal and the ideal component of the fifth signal is PH1+PH2, and the absolute value of the phase difference between the ideal component of the second signal and the ideal component of the sixth signal is PH3+PH4. When PH1, PH2, PH3 and PH4 are all 60° as mentioned above, PH1+PH2 and PH3+PH4 are both 120°.

Figure 3:
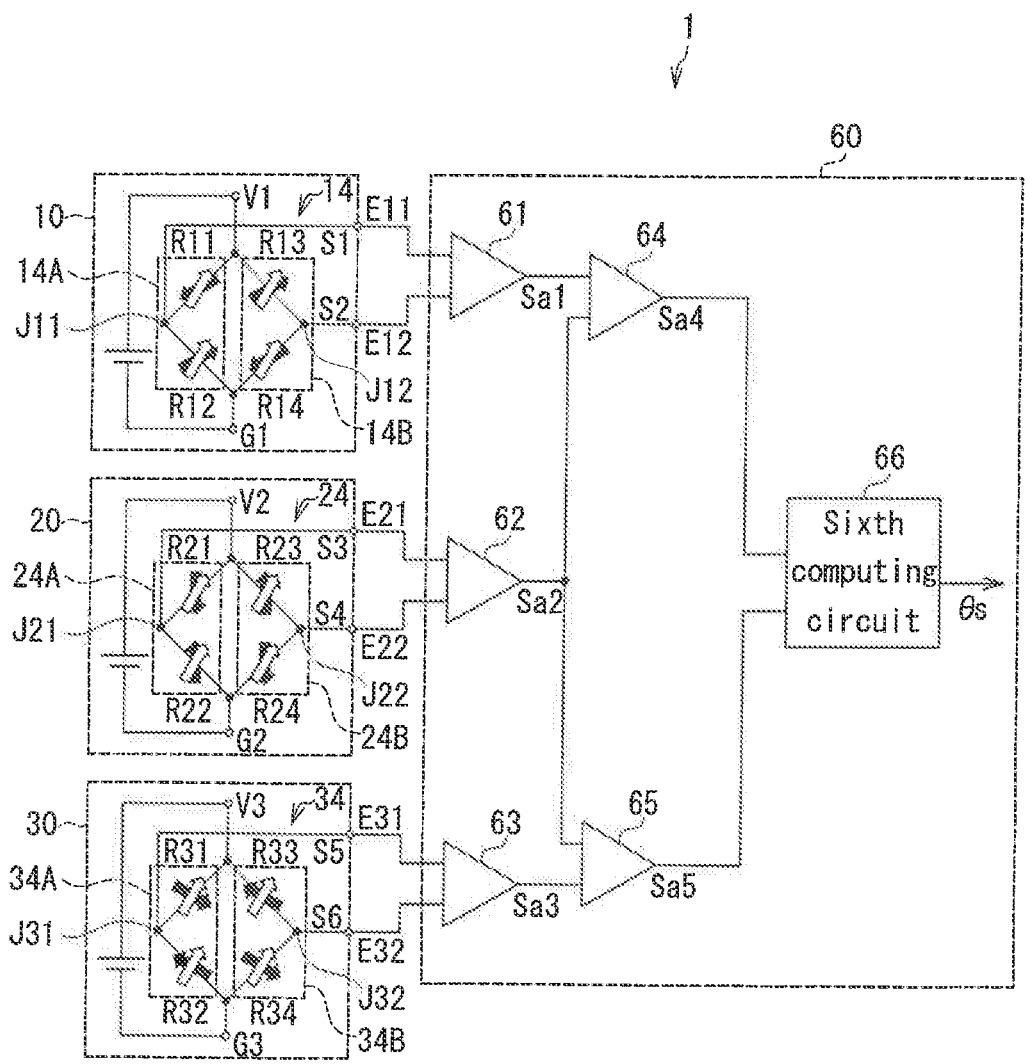
FIG. 3 is a circuit diagram illustrating the configuration of the rotating field sensor according to the first embodiment of the invention.

Now, the configuration of the rotating field sensor 1 will be described in detail with reference to FIG. 3. FIG. 3 is a circuit diagram illustrating the configuration of the rotating field sensor 1. The first detection circuit 10 includes a Wheatstone bridge circuit 14, a power supply port V1, a ground port G1, and two output ports E11 and E12. The Wheatstone bridge circuit 14 includes the first signal generation unit 14A and the second signal generation unit 14B. The first signal generation unit 14A includes two magnetic detection elements R11 and R12 connected in series. The second signal generation unit 14B includes two magnetic detection elements R13 and R14 connected in series. The first signal S1 is output from a junction J11 between the magnetic detection element R11 and the magnetic detection element R12. The second signal S2 is output from a junction J12 between the magnetic detection element R13 and the magnetic detection element R14.

The junction J11 is connected to the output port E11. The junction J12 is connected to the output port E12. An end of the magnetic detection element R11 farther from the magnetic detection element R12 is connected to the power supply port V1 and to an end of the magnetic detection element R13 farther from the magnetic detection element R14. An end of the magnetic detection element R12 farther from the magnetic detection element R11 is connected to the ground port G1 and to an end of the magnetic detection element R14 farther from the magnetic detection element R13. A predetermined voltage is applied between the power supply port V1 and the ground port. G1. As a result, a predetermined voltage is applied between the end of the magnetic detection element R11 and the end of the magnetic detection element R12 farther from each other, and between the end of the magnetic detection element R13 and the end of the magnetic detection element R14 farther from each other.

The second and third detection circuits 20 and 30 are configured in the same manner as the first detection circuit 10. More specifically, the second detection circuit 20 includes a Wheatstone bridge circuit 24, a power supply port V2, a ground port G2, and two output ports E21 and E22. The Wheatstone bridge circuit 24 includes the third signal generation unit 24A and the fourth signal generation unit 24B. The third signal generation unit 24A includes two magnetic detection elements R21 and R22 connected in series. The fourth signal generation unit 24B includes two magnetic detection elements R23 and R24 connected in series. The third signal S3 is output from a junction J21 between the magnetic detection element R21 and the magnetic detection element R22. The fourth signal S4 is output from a junction J22 between the magnetic detection element R23 and the magnetic detection element R24.

The junction J21 is connected to the output port E21. The junction J22 is connected to the output port E22. An end of the magnetic detection element R21 farther from the magnetic detection element R22 is connected to the power supply port V2 and to an end of the magnetic detection element R23 farther from the magnetic detection element R24. An end of the magnetic detection element R22 farther from the magnetic detection element R21 is connected to the ground port G2 and to an end of the magnetic detection element R24 farther from the magnetic detection element R23. A predetermined voltage is applied between the power supply port V2 and the ground port G2. As a result, a predetermined voltage is applied between the end of the magnetic detection element R21 and the end of the magnetic detection element R22 farther from each other, and between the end of the magnetic detection element R23 and the end of the magnetic detection element R24 farther from each other.

The third detection circuit 30 includes a Wheatstone bridge circuit 34, a power supply port V3, a ground port G3, and two output ports E31 and E32. The Wheatstone bridge circuit 84 includes the fifth signal generation unit 34A and the sixth signal generation unit 34B. The fifth signal generation unit 34A includes two magnetic detection elements R31 and R32 connected in series. The sixth signal generation unit 34B includes two magnetic detection elements R33 and R34 connected in series. The fifth signal S5 is output from a junction J31 between the magnetic detection element R31 and the magnetic detection element R32. The sixth signal S6 is output from a junction J32 between the magnetic detection element R33 and the magnetic detection element R34.

The junction J31 is connected to the output port E31. The junction J32 is connected to the output port E32. An end of the magnetic detection element R31 farther from the magnetic detection element R32 is connected to the power supply port V3 and to an end of the magnetic detection element R33 farther from the magnetic detection element R34. An end of the magnetic detection element R32 farther from the magnetic detection element R31 is connected to the ground port G3 and to an end of the magnetic detection element R34 farther from the magnetic detection element R33. A predetermined voltage is applied between the power supply port V3 and the ground port G3. As a result, a predetermined voltage is applied between the end of the magnetic detection element R31 and the end of the magnetic detection element R32 farther from each other, and between the end of the magnetic detection element R33 and the end of the magnetic detection element R34 farther from each other.

In the first embodiment, all the magnetic detection elements included in the first to sixth signal generation units 14A, 14B, 24A, 24B, 34A and 34B are magnetoresistive (MR) elements, and more specifically, spin-valve MR elements. The spin-valve MR elements may be TMR elements or GMR elements. GMR and TMR elements each include a magnetization pinned layer whose magnetization direction is pinned, a free layer which is a magnetic layer whose magnetization direction varies depending on the direction DM of the rotating magnetic field MF, and a nonmagnetic layer disposed between the magnetization pinned layer and the free layer. For TMR elements, the nonmagnetic layer is a tunnel barrier layer. For GMR elements, the nonmagnetic layer is a nonmagnetic conductive layer. Each of TMR and GMR elements varies in resistance depending on the angle that the magnetization direction of the free layer forms with respect to the magnetization direction of the magnetization pinned layer, and has a minimum resistance when the foregoing angle is 0°, and a maximum resistance when the foregoing angle is 180°. In the following description, the magnetic detection elements included in the first to sixth signal generation units 14A, 14B, 24A, 24B, 34A and 34B will be referred to as MR elements. In FIG. 3, the filled arrows indicate the magnetization directions of the magnetization pinned layers of the MR elements, and the hollow arrows indicate the magnetization directions of the free layers of the MR elements.

In the first signal generation unit 14A, the magnetization direction of the magnetization pinned layer of the MR element R11 is the same as the first direction D1, and the magnetization direction of the magnetization pinned layer of the MR element R12 is opposite to that of the magnetization pinned layer of the MR element R11. In this case, the potential at the junction J11 varies depending on the relative angle between the direction DM of the rotating magnetic field MF and the first direction D1. Thus, the first signal generation unit 14A generates the first signal S1 responsive to the direction DM of the rotating magnetic field MF. The first signal S1 is eventually output from the output port E11.

In the second signal generation unit 14B, the magnetization direction of the magnetization pinned layer of the MR element R13 is the same as the second direction D2, and the magnetization direction of the magnetization pinned layer of the MR element R14 is opposite to that of the magnetization pinned layer of the MR element R13. In this case, the potential at the junction J12 varies depending on the relative angle between the direction DM of the rotating magnetic field MF and the second direction D2. Thus, the second signal generation unit 14B generates the second signal S2 responsive to the direction DM of the rotating magnetic field MF. The second signal S2 is eventually output from the output port E12.

In the third signal generation unit 24A, the magnetization direction of the magnetization pinned layer of the MR element R21 is the same as the third direction D3, and the magnetization direction of the magnetization pinned layer of the MR element R22 is opposite to that of the magnetization pinned layer of the MR element R21. In this case, the potential at the junction J21 varies depending on the relative angle between the direction DM of the rotating magnetic field MF and the third direction D3. Thus, the third signal generation unit 24A generates the third signal S3 responsive to the direction DM of the rotating magnetic field MF. The third signal S3 is eventually output from the output port E21.

In the fourth signal generation unit 24B, the magnetization direction of the magnetization pinned layer of the MR element R23 is the same as the fourth direction D4, and the magnetization direction of the magnetization pinned layer of the MR element R24 is opposite to that of the magnetization pinned layer of the MR element R23. In this case, the potential at the junction J22 varies depending on the relative angle between the direction DM of the rotating magnetic field MF and the fourth direction D4. Thus, the fourth signal generation unit 24B generates the fourth signal S4 responsive to the direction DM of the rotating magnetic field MF. The fourth signal S4 is eventually output from the output port E22.

In the fifth signal generation unit 34A, the magnetization direction of the magnetization pinned layer of the MR element R31 is the same as the fifth direction D5, and the magnetization direction of the magnetization pinned layer of the MR element R32 is opposite to that of the magnetization pinned layer of the MR element R31. In this case, the potential at the junction J31 varies depending on the relative angle between the direction DM of the rotating magnetic field MF and the fifth direction D5. Thus, the fifth signal generation unit 34A generates the fifth signal S5 responsive to the direction DM of the rotating magnetic field MF. The fifth signal S5 is eventually output from the output port E31.

In the sixth signal generation unit 34B, the magnetization direction of the magnetization pinned layer of the MR element R33 is the same as the sixth direction D6, and the magnetization direction of the magnetization pinned layer of the MR element R34 is opposite to that of the magnetization pinned layer of the MR element R33. In this case, the potential at the junction J32 varies depending on the relative angle between the direction DM of the rotating magnetic field MF and the sixth direction D6. Thus, the sixth signal generation unit 34B generates the sixth signal S6 responsive to the direction DM of the rotating magnetic field MF. The sixth signal S6 is eventually output from the output port E32.

In consideration of the production accuracy of the MR elements and other factors, the magnetization directions of the magnetization pinned layers of the plurality of MR elements in the first to sixth signal generation units 14A, 14B, 24A, 24B, 34A and 34B may be slightly different from those described above.

The Wheatstone bridge circuits 14, 24 and 34 may have the same mechanical structure and be placed in the same orientation, with only the magnetization directions of the plurality of magnetization pinned layers included therein varied among the Wheatstone bridge circuits 14, 24 and 34, as shown in FIG. 3. Alternatively, in addition to having the same mechanical structure, the Wheatstone bridge circuits 14, 24, and 34 may be configured so that the magnetizations of the plurality of magnetization pinned layers included therein are in the same relative direction with respect to the mechanical structure. In this case, placing the Wheatstone bridge circuits 14, 24 and 34 in orientations different from each other allows the magnetization directions of the plurality of magnetization pinned layers included therein to be varied among the Wheatstone bridge circuits 14, 24 and 34 as shown in FIG. 3.

Figure 5:
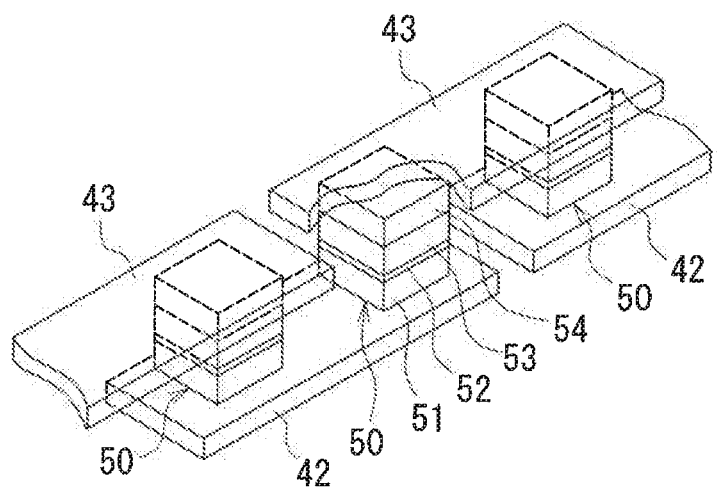
FIG. 5 is a perspective view of a portion of an MR element shown in FIG. 3.

An example of the configuration of the MR elements will now be described with reference to FIG. 5. FIG. 5 is a perspective view illustrating a portion of an MR element in the rotating field sensor 1 shown in FIG. 3. In this example, the MR element includes a plurality of lower electrodes 42, a plurality of MR films 50 and a plurality of upper electrodes 43. The plurality of lower electrodes 42 are arranged on a substrate (not illustrated). Each of the lower electrodes 42 has a long slender shape. Every two lower electrodes 42 that adjoin in the longitudinal direction of the lower electrodes 42 have a gap therebetween. As shown in FIG. 5, MR films 50 are provided on the top surfaces of the lower electrodes 42, near opposite ends in the longitudinal direction. Each of the MR films 50 includes a free layer 51, a nonmagnetic layer 52, a magnetization pinned layer 53, and an antiferromagnetic layer 54 which are stacked in this order, the free layer 51 being closest to the lower electrode 42. The free layer 51 is electrically connected to the lower electrode 42. The antiferromagnetic layer 54 is formed of an antiferromagnetic material. The antiferromagnetic layer 54 is in exchange coupling with the magnetization pinned layer 53 so as to pin the magnetization direction of the magnetization pinned layer 53. The plurality of upper electrodes 43 are arranged over the plurality of MR films 50. Each of the upper electrodes 43 has a long slender shape, and establishes electrical connection between the respective antiferromagnetic layers 54 of two adjoining MR films 50 that are arranged on two lower electrodes 42 adjoining in the longitudinal direction of the lower electrodes 42. With such a configuration, the plurality of MR films 50 in the MR element shown in FIG. 5 are connected in series by the plurality of lower electrodes 42 and the plurality of upper electrodes 43. It should be appreciated that the layers 51 to 54 of the MR films 50 may be stacked in an order reverse to that shown in FIG. 5.

The rotating field sensor 1 further includes an angle detection unit 60 configured to generate a detected angle value θs based on the first to sixth signals S1 to S6. The detected angle value θs has a correspondence relationship with the angle θ that the direction DM of the rotating magnetic field MF in the reference position PR forms with respect to the reference direction DR. As shown in FIG. 3, the angle detection unit 60 includes a first computing circuit 61, a second computing circuit 62, a third computing circuit 63, a fourth computing circuit 64, a fifth computing circuit 65, and a sixth computing circuit 66.

Each of the first to sixth computing circuits 61 to 66 has a first input, a second input, and an output. The first and second inputs of the first computing circuit 61 are connected to the output ports E11 and E12, respectively. The first and second inputs of the second computing circuit 62 are connected to the output ports E21 and E22, respectively. The first and second inputs of the third computing circuit 63 are connected to the output ports E31 and E32, respectively. The first and second inputs of the fourth computing circuit 64 are connected to the outputs of the first and second computing circuits 61 and 62, respectively. The first and second inputs of the fifth computing circuit 65 are connected to the outputs of the second and third computing circuits 62 and 63, respectively. The first and second inputs of the sixth computing circuit 66 are connected to the outputs of the fourth and fifth computing circuits 64 and 65, respectively.

The first computing circuit 61 receives the first and second signals S1 and S2 and generates a first post-computation signal Sa1 based on the first and second signals S1 and S2. The second computing circuit 62 receives the third and fourth signals S3 and S4 and generates a second post-computation signal Sa2 based on the third and fourth signals S3 and S4. The third computing circuit 63 receives the fifth and sixth signals S5 and S6 and generates a third post-computation signal Sa3 based on the fifth and sixth signals S5 and S6. The fourth computing circuit 64 receives the first and second post-computation signals Sa1 and Sa2 and generates a fourth post-computation signal Sa4 based on the first and second post-computation signals Sa1 and Sa2. The fifth computing circuit 65 receives the second and third post-computation signals Sa2 and Sa3 and generates a fifth post-computation signal Sa5 based on the second and third post-computation signals Sa2 and Sa3. The sixth computing circuit 66 receives the fourth and fifth post-computation signals Sa4 and Sa5 and determines the detected angle value θs based on the fourth and fifth post-computation signals Sa4 and Sa5.

The first to sixth computing circuits 61 to 66 can be implemented by a single microcomputer, for example.

A method for determining the detected angle value θs will now be described. To begin with, how to generate the first to third post-computation signals Sa1 to Sa3 will be described. The first to third post-computation signals Sa1 to Sa3 are generated based on the first to sixth signals S1 to S6. Ideally, each of the first to sixth signals S1 to S6 should contain only the ideal component described previously and have a waveform tracing a sinusoidal curve (including a sine waveform and a cosine waveform). In actuality, however, the waveforms of the first to sixth signals S1 to S6 are distorted from a sinusoidal curve due to the MR elements. One example of the situations where the waveforms of the first to sixth signals S1 to S6 are distorted due to the MR elements is where the magnetization directions of the magnetization pinned layers vary under the influence of the rotating magnetic field MF or like factors. This is likely to occur when the rotating magnetic field MF is relatively high in strength. Another example of the situations where the waveforms of the first to sixth signals S1 to S6 are distorted due to the MR elements is where the magnetization directions of the free layers differ from the direction DM of the rotating magnetic field MF due to effects such as the shape anisotropy and coercivity of the free layers. This is likely to occur when the rotating magnetic field MF is relatively low in strength.

The first to sixth signals S1 to S6 whose waveforms are distorted from a sinusoidal curve each contain a signal error in addition to the ideal component. The signal error is composed mainly of an error component of a period of ½ the predetermined signal period T and an error component of a period of ⅓ the predetermined signal period T. Thus, each of the first to sixth signals S1 to S6 contains the error component of the period of ½ the predetermined signal period T and the error component of the period of ⅓ the predetermined signal period T. Hereinafter, the error component of the period of ½ the predetermined signal period T will be referred to as the second harmonic component, and the error component of the period of ⅓ the predetermined signal period T will be referred to as the third harmonic component.

In the first embodiment, as previously described, the absolute value PH1 of the phase difference between the ideal component of the first signal S1 and the ideal component of the third signal S3, and the absolute value PH2 of the phase difference between the ideal component of the third signal S3 and the ideal component of the fifth signal S5 are both preferably 60°, i.e., π/3. The ideal components of the first, third, and fifth signals S1, S3, and S5 will thus be expressed as $\sin(\theta-\pi/3)$, sine, and $\sin(\theta+\pi/3)$, respectively.

The absolute value of the phase difference between the ideal component of the first signal S1 and the ideal component of the second signal S2, the absolute value of the phase difference between the ideal component of the third signal S3 and the ideal component of the fourth signal S4, and the absolute value of the phase difference between the ideal component of the fifth signal S5 and the ideal component of the sixth signal S6 are all preferably 180°. The absolute value PH3 of the phase difference between the ideal component of the second signal S2 and the ideal component of the fourth signal S4, and the absolute value PH4 of the phase difference between the ideal component of the fourth signal S4 and the ideal component of the sixth signal S6 are both preferably 60°, i.e., π/3. Thus, the ideal components of the second, fourth, and sixth signals S2, S4, and S6 are expressed as $\sin(\theta-\pi/3-\pi)$, $\sin(\theta-\pi)$, and $\sin(\theta+\pi/3-\pi)$, respectively. These expressions for the ideal components of the second, fourth, and sixth signals S2, S4, and S6 can be transformed into $-\sin(\theta-\pi/3)$, $-\sin\theta$, and $-\sin(\theta+\pi/3)$, respectively.

The second harmonic components of the first to sixth signals S1, S2, S3, S4, S5, and S6 can be expressed as $p\cdot\sin\{2(\theta-\pi/3)\}$, $p\cdot\sin\{2(\theta-\pi/3-\pi)\}$, $p\cdot\sin 2\theta$, $p\cdot\sin\{2(\theta-\pi)\}$, $p\cdot\sin\{2(\theta+\pi/3)\}$, and $p\cdot\sin\{2(\theta+\pi/3-\pi)\}$, respectively. Transforming the above expressions for the second harmonic components of the signals S2, S4 and S6 results in that the second harmonic components of the first and second signals S1 and S2 each equal $p\cdot\sin(2\theta-2\pi/3)$, the second harmonic components of the third and fourth signals S3 and S4 each equal $p\cdot\sin 2\theta$, and the second harmonic components of the fifth and sixth signals S5 and S6 each equal $p\cdot\sin(2\theta+2\pi/3)$. Note that p represents the amplitude of the second harmonic components of the first to sixth signals S1 to S6, and is any value satisfying $0<|p|<1$.

The third harmonic components of the first to sixth signals S1, S2, S3, S4, S5, and S6 can be expressed as $q\cdot\sin\{3(\theta-\pi/3)\}$, $q\cdot\sin\{3(\theta-\pi/3-\pi)\}$, $q\cdot\sin 3\theta$, $q\cdot\sin\{3(\pi-\pi)\}$, $q\cdot\sin\{3(\theta+\pi/3)\}$, and $q\cdot\sin\{3(\theta+\pi/3-\pi)\}$, respectively. Transforming the above expressions for the third harmonic components of the signals S1, S2 and S4 to S6 results in that the third harmonic components of the first, fourth and fifth signals S1, S4 and S5 each equal $-q\cdot\sin 3\theta$, and the third harmonic components of the second, third and sixth signals S2, S3 and S6 each equal $q\cdot\sin 3\theta$. Note that q represents the amplitude of the third harmonic components of the first to sixth signals S1 to S6, and is any value satisfying $0<|q|<1$.

In the first embodiment, the first post-computation signal Sa1 is generated by computation including determining the difference (S1−S2) between the first signal S1 and the second signal S2. Determining the difference (S1−S2) between the first signal S1 and the second signal S2 allows the ideal component Sa11, the second harmonic component Sa12, and the third harmonic component Sa13 of the first post-computation signal Sa1 to be expressed by the following Equations (1A), (1B), and (1C), respectively. Note that the phrase "computation including determining the difference (S1−S2) between the first signal S1 and the second signal S2" means that the computation can include not only determining the difference (S1−S2) between the first signal S1 and the second signal S2, but also multiplying (S1−S2) by a predetermined coefficient or adding/subtracting a predetermined value to/from (S1−S2) for normalization or the like after determining (S1−S2). This also applies to other similar phrases.

$$Sa11 = \sin(\theta-\pi/3)-\{-\sin(\theta-\pi/3)\} \qquad (1A)$$
$$= 2\sin(\theta-\pi/3)$$

$$Sa12 = p\cdot\sin(2\theta-2\pi/3)-p\cdot\sin(2\theta-2\pi/3) \qquad (1B)$$
$$= 0$$

$$Sa13 = -q\cdot\sin 3\theta - q\cdot\sin 3\theta \qquad (1C)$$
$$= -2q\cdot\sin 3\theta$$

As can be seen from Equation (1B), in the first embodiment, the second harmonic component of the first signal S1 and the second harmonic component of the second signal S2 cancel each other out completely when the first post-computation signal Sa1 is generated. Thus, the second harmonic component Sa12 of the first post-computation signal Sa1 is zero. As will be described later, the absolute value of the amplitude of the second harmonic component Sa12 of the first post-computation signal Sa1 is smaller than the absolute value |p| of the amplitude of the second harmonic components of the first and second signals S1 and S2 not only when the absolute value of the phase difference between the ideal component of the first signal S1 and the ideal component of the second signal S2 is 180° but as long as the absolute value of this phase difference is greater than 150° and smaller than 210°. In this manner, the first computing circuit 61 generates, based on the first and second signals S1 and S2, the first post-computation signal Sa1 with the second harmonic component reduced as compared with the first and second signals S1 and S2.

Further, in the first embodiment, the second post-computation signal Sa2 is generated by computation including determining the difference (S3−S4) between the third signal S3 and the fourth signal S4. Determining the difference (S3−S4) between the third signal S3 and the fourth signal S4 allows the ideal component Sa21, the second harmonic component Sa22, and the third harmonic component Sa23 of the second post-computation signal Sa2 to be expressed by the following Equations (2A), (2B), and (2C), respectively.

$$Sa21 = \sin\theta - \{-\sin\theta\} \qquad (2A)$$
$$= 2\sin\theta$$

$$Sa22 = p\cdot\sin 2\theta - p\cdot\sin 2\theta \qquad (2B)$$
$$= 0$$

$$Sa23 = q\cdot\sin 3\theta - \{-q\cdot\sin 3\theta\} \qquad (2C)$$
$$= 2q\cdot\sin 3\theta$$

As can be seen from Equation (2B), in the first embodiment, the second harmonic component of the third signal S3 and the second harmonic component of the fourth signal S4 cancel each other out completely when the second post-computation signal Sa2 is generated. Thus, the second harmonic component Sa22 of the second post-computation signal Sa2 is zero. As is the case with the second harmonic component Sa12 of the first post-computation signal Sa1, the absolute value of the amplitude of the second harmonic component Sa22 of the second post-computation signal Sa2 is smaller than the absolute value |p| of the amplitude of the second harmonic components of the third and fourth signals S3 and S4 not only when the absolute value of the phase difference between the ideal component of the third signal S3 and the ideal component of the fourth signal S4 is 180° but as long as the absolute value of this phase difference is greater than 150° and smaller than 210°. In this manner, the second computing circuit 62 generates, based on the third and fourth signals S3 and S4, the second post-computation signal Sa2 with the second harmonic component reduced as compared with the third and fourth signals S3 and S4.

Further, in the first embodiment, the third post-computation signal Sa3 is generated by computation including determining the difference (S5−S6) between the fifth signal S5 and the sixth signal S6. Determining the difference (S5−S6) between the fifth signal S5 and the sixth signal S6 allows the ideal component Sa31, the second harmonic component Sa32, and the third harmonic component Sa33 of the third post-computation signal Sa3 to be expressed by the following Equations (3A), (3B), and (3C), respectively.

$$Sa31 = \sin(\theta + \pi/3) - \{-\sin(\theta + \pi/3)\} \quad (3A)$$
$$= 2\sin(\theta + \pi/3)$$

$$Sa32 = p \cdot \sin(2\theta + 2\pi/3) - p \cdot \sin(2\theta + 2\pi/3) \quad (3B)$$
$$= 0$$

$$Sa33 = -q \cdot \sin 3\theta - q \cdot \sin 3\theta \quad (3C)$$
$$= -2q \cdot \sin 3\theta$$

As can be seen from Equation (3B), in the first embodiment, the second harmonic component of the fifth signal S5 and the second harmonic component of the sixth signal S6 cancel each other out completely when the third post-computation signal Sa3 is generated. Thus, the second harmonic component Sa32 of the third post-computation signal Sa3 is zero. As is the case with the second harmonic component Sa12 of the first post-computation signal Sa1, the absolute value of the amplitude of the second harmonic component Sa32 of the third post-computation signal Sa3 is smaller than the absolute value |p| of the amplitude of the second harmonic components of the fifth and sixth signals S5 and S6 not only when the absolute value of the phase difference between the ideal component of the fifth signal S5 and the ideal component of the sixth signal S6 is 180° but as long as the absolute value of this phase difference is greater than 150° and smaller than 210°. In this manner, the third computing circuit 63 generates, based on the fifth and sixth signals S5 and S6, the third post-computation signal Sa3 with the second harmonic component reduced as compared with the fifth and sixth signals S5 and S6.

Next, how to generate the fourth and fifth post-computation signals Sa4 and Sa5 will be described. In the first embodiment, the fourth post-computation signal Sa4 is generated by computation including determining the sum of the first post-computation signal Sa1 and the second post-computation signal Sa2. Determining the sum of the first post-computation signal Sa1 and the second post-computation signal Sa2 allows the ideal component Sa41 and the third harmonic component Sa43 of the fourth post-computation signal Sa4 to be expressed by the following Equations (4A) and (4B), respectively. Note that since the second harmonic component Sa12 of the first post-computation signal Sa1 and the second harmonic component Sa22 of the second post-computation signal Sa2 are both zero, the fourth post-computation signal Sa4 contains no second harmonic component.

$$Sa41 = Sa11 + Sa21 \quad (4A)$$
$$= 2\sin(\theta - \pi/3) + 2\sin\theta$$
$$= 4\sin(\theta - \pi/6) \cdot \cos(-\pi/6)$$
$$= 3.46\sin(\theta - \pi/6)$$

$$Sa43 = Sa13 + Sa23 \quad (4B)$$
$$= -2q \cdot \sin 3\theta + 2q \cdot \sin 3\theta$$
$$= 0$$

As can be seen from Equation (4B), in the first embodiment, the third harmonic component Sa13 of the first post-computation signal Sa1 and the third harmonic component Sa23 of the second post-computation signal Sa2 cancel each other out completely when the fourth post-computation signal Sa4 is generated. Thus, the third harmonic component Sa43 of the fourth post-computation signal Sa4 is zero. As will be described later, the absolute value of the amplitude of the third harmonic component Sa43 of the fourth post-computation signal Sa4 is smaller than the absolute value |2q| of the amplitude of the third harmonic components Sa13 and Sa23 not only when PH1 and PH3 are both 60° but as long as PH1 and PH3 are both greater than 40° and smaller than 80°. In this manner, the fourth computing circuit 64 generates, based on the first and second post-computation signals Sa1 and Sa2, the fourth post-computation signal Sa4 with the third harmonic component reduced as compared with the first and second post-computation signals Sa1 and Sa2.

Further, in the first embodiment, the fifth post-computation signal Sa5 is generated by computation including determining the sum of the second post-computation signal Sa2 and the third post-computation signal Sa3. Determining the sum of the second poet-computation signal Sa2 and the third post-computation signal Sa3 allows the ideal component Sa51 and the third harmonic component Sa53 of the fifth post-computation signal Sa5 to be expressed by the following Equations (5A) and (5B), respectively. Note that since the second harmonic component Sa22 of the second post-computation signal Sa2 and the second harmonic component Sa32 of the third post-computation signal Sa3 are both zero, the fifth post-computation signal Sa5 contains no second harmonic component.

$$Sa51 = Sa21 + Sa31 \quad (5A)$$
$$= 2\sin\theta + 2\sin(\theta + \pi/3)$$
$$= 4\sin(\theta + \pi/6) \cdot \cos(-\pi/6)$$
$$= 3.46\sin(\theta + \pi/6)$$

$$Sa53 = Sa23 + Sa33 \quad (5B)$$
$$= 2q \cdot \sin 3\theta - 2q \cdot \sin 3\theta$$
$$= 0$$

As can be seen from Equation (5B), in the first embodiment, the third harmonic component Sa23 of the second post-computation signal Sa2 and the third harmonic component Sa33 of the third post-computation signal Sa3 cancel each other out completely when the fifth post-computation signal Sa5 is generated. Thus, the third harmonic component Sa53 of the fifth post-computation signal Sa5 is zero. As is the case with the third harmonic component Sa43 of the fourth post-computation signal Sa4, the absolute value of the amplitude of the third harmonic component Sa53 of the fifth post-computation signal Sa5 is smaller than the absolute value |2q| of the amplitude of the third harmonic components Sa23 and Sa33 not only when PH2 and PH4 are both 60° but as long as PH2 and PH4 are both greater than 40° and smaller than 80°. In this manner, the fifth computing circuit 65 generates, based on the second and third post-computation signals Sa2 and Sa3, the fifth post-computation signal Sa5 with the third harmonic component reduced as compared with the second and third post-computation signals Sa2 and Sa3.

Figure 4:
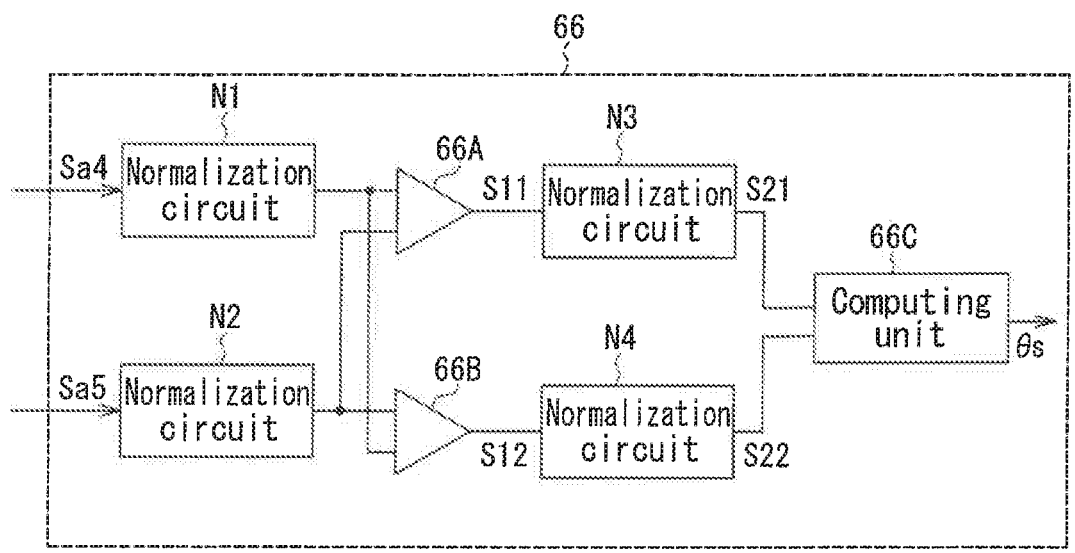
FIG. 4 is a block diagram illustrating the configuration of the sixth computing circuit shown in FIG. 3.

Now, reference is made to FIG. 4 to describe the configuration of the sixth computing circuit 66 and how the sixth computing circuit 66 determines the detected angle value θs. FIG. 4 is a block diagram illustrating the configuration of the sixth computing circuit 66. The sixth computing circuit 66 includes normalization circuits N1, N2, N3 and N4, an adder circuit 66A, a subtractor circuit 66B, and a computing unit 66C.

Each of the normalization circuits N1, N2, N3 and N4 has an input and an output. Each of the adder circuit 66A, the subtractor circuit 66B and the computing unit 66C has two inputs and an output. The input of the normalization circuit N1 is connected to the output of the fourth computing circuit 64 shown in FIG. 3. The input of the normalization circuit N2 is connected to the output of the fifth computing circuit 65 shown in FIG. 3. The two inputs of the adder circuit 66A are connected to the respective outputs of the normalization circuits N1 and N2. The two inputs of the subtractor circuit 66B are also connected to the respective outputs of the normalization circuits N1 and N2. The input of the normalization circuit N3 is connected to the output of the adder circuit 66A. The input of the normalization circuit N4 is connected to the output of the subtractor circuit 66B. The two inputs of the computing circuit 66C are connected to the respective outputs of the normalization circuits N3 and N4.

The normalization circuit N1 outputs a normalized value of the fourth post-computation signal Sa4 to the adder circuit 66A and the subtractor circuit 66B. The normalization circuit N2 outputs a normalized value of the fifth post-computation signal Sa5 to the adder circuit 66A and the subtractor circuit 66B. The normalization circuits N1 and N2 normalize the post-computation signals Sa4 and Sa5, respectively, in such a manner that the post-computation signals Sa4 and Sa5 both have a maximum value of 1 and a minimum value of −1. In this case, from Equation (4A), the normalized value of the fourth post-computation signal Sa4 is $\sin(\theta-\pi/6)$. From Equation (5A), the normalized value of the fifth post-computation signal Sa5 is $\sin(\theta+\pi/6)$.

The adder circuit 66A generates an addition signal S11 by computation including determining the sum of the normalized value of the fourth post-computation signal Sa4 and the normalized value of the fifth post-computation signal Sa5. The subtractor circuit 66B generates a subtraction signal S12 by computation including determining the difference between the normalized value of the fourth post-computation signal Sa4 and the normalized value of the fifth post-computation signal Sa5. The addition signal S11 and the subtraction signal S12 are expressed by the following Equations (6A) and (6B), respectively.

$$S11 = \sin(\theta-\pi/6) + \sin(\theta+\pi/6) \qquad (6A)$$
$$= 2\sin\theta \cdot \cos(-\pi/6)$$
$$= 1.73\sin\theta$$

$$S12 = \sin(\theta+\pi/6) - \sin(\theta-\pi/6) \qquad (6B)$$
$$= 2\sin(\pi/6) \cdot \cos\theta$$
$$= \cos\theta$$

The normalization circuit N3 outputs a normalized value S21 of the addition signal S11 to the computing unit 66C. The normalization circuit N4 outputs a normalized value S22 of the subtraction signal S12 to the computing unit 66C. The normalization circuits N3 and N4 normalize the signals S11 and S12, respectively, in such a manner that the signals S11 and S12 both have a maximum value of 1 and a minimum value of −1. In this case, the value S21 equals sine, and the value S22 equals cos θ.

Based on the values S21 and S22, the computing unit 66C determines the detected angle value θs having a correspondence relationship with the angle θ. More specifically, for example, the computing unit 66C determines θs by Equation (6C) below, where "a tan" represents arctangent.

$$\theta s = a\ \tan(S21/S22) \qquad (6C)$$

The term "a tan(S21/S22)" of Equation (6C) represents the arctangent calculation for determining Os. For Os in the range of 0° (inclusive) to 360° (exclusive), there are two solutions of Os in Equation (6C) with a difference of 180° in value. Which of the two solutions of Os in Equation (6C) is the true value of θs can be determined from the combination of positive and negative signs on S21 and S22. More specifically, if S21 is positive in value, θs is greater than 0° and smaller than 180°. If S21 is negative in value, θs is greater than 180° and smaller than 360°. If S22 is positive in value, θs is between 0° (inclusive) and 90° (exclusive), and between 270° (exclusive) and 360° (inclusive). If S22 is negative in value, θs is greater than 90° and smaller than 270°. Using Equation (6C) and based on the foregoing determination made with the combination of positive and negative signs on S21 and S22, the computing unit 66C determines θs within the range of 0° (inclusive) to 360° (exclusive).

The computing unit 66C may determine the detected angle value θs in the following manner. First, the computing unit 66C determines at least one first candidate for the detected angle value θs based on the normalized value S21 of the addition signal S11. More specifically, for example, the computing unit 660C determines the at least one first candidate for θs by Equation (6D) below, where "a sin" represents arcsine.

$$\theta s = a\ \sin(S21) \qquad (6D)$$

S21 takes on a single value for two different values of θ falling within the range of 0° (inclusive) to 360° (exclusive) except when 821 is maximum or minimum in value. Thus, according to the above-described method, two first candidates for the detected angle value θs are obtained for a single value of S21 in most cases.

Next, the computing unit 66C determines at least one second candidate for the detected angle value θs based on the normalized value S22 of the subtraction signal S12. More specifically, for example, the computing unit 66C determines the at least one second candidate for θs by Equation (6E) below, where "a cos" represents arccosine.

$$\theta s = a\ \cos(S22) \qquad (6E)$$

As with Equation (6D), two second candidates for the detected angle value θs are obtained for a single value of S22 in most cases. One of the two first candidates and one of the two second candidates should be identical with or very close to each other. If there exists a pair of first and second candidates identical with each other, the computing unit 66C takes the identical first and second candidates as the detected angle value θs. If there exists a pair of first and second candidates not identical with but very close to each other, the computing unit 66C takes the first candidate in that pair as the detected angle value θs.

Now, a description will be given of the reason why the first embodiment specifies that the absolute value of the phase difference between the ideal component of the first signal S1 and the ideal component of the second signal S2, the absolute value of the phase difference between the ideal component of the third signal S3 and the ideal component of the fourth signal S4, and the absolute value of the phase difference between the ideal component of the fifth signal S5 and the ideal component of the sixth signal S6 are all greater than 150° and smaller than 210°. Let PH5 be the absolute value of the phase difference between the ideal component of the first signal S1 and the ideal component of the second signal S2, let PH6 be the absolute value of the phase difference between the ideal component of the third signal S3 and the ideal component of the fourth signal S4, and let PH7 be the absolute value of the phase difference between the ideal component of the fifth signal S5 and the ideal component of the sixth signal S6. Here, discussion will be made with reference to PH6. When PH6 is 150°, i.e., 5π/6, the second harmonic components of the third and fourth signals S3 and S4 equal p·sin 2θ and p·sin {2(θ−5π/6)}, respectively. In this case, the second harmonic component Sa22 of the second post-computation signal Sa2 is expressed by Equation (7) below.

$$Sa22 = p \cdot \sin 2\theta - p \cdot \sin\{2(\theta - 5\pi/6)\} \quad (7)$$
$$= 2p \cdot \sin(5\pi/6) \cdot \cos(2\theta - 5\pi/6)$$
$$= p \cdot \cos(2\theta - 5\pi/6)$$

When PH6 is 210°, i.e., 7π/6, the second harmonic components of the third and fourth signals S3 and S4 equal p·sin 2θ and p·sin{2(θ−7π/6)}, respectively. A computation similar to Equation (7) determines that the second harmonic component Sa22 of the second post-computation signal Sa2 equals −p·cos(2θ−7π/6).

Thus, when PH6 is 150° or 210°, the absolute value of the amplitude of the second harmonic component Sa22 is |p|, being equal to the absolute value |p| of the amplitude of the second harmonic components of the third and fourth signals S3 and S4. If PH6 is greater than 150° and smaller than 210°, the absolute value of the amplitude of the second harmonic component Sa22 is smaller than the absolute value |p| of the amplitude of the second harmonic components of the third and fourth signals S3 and S4. When PH6 is 180°, in particular, the amplitude of the second harmonic component Sa22 is zero. Thus, the condition that PH6 is greater than 150° and smaller than 210° is a necessary condition for generating the second post-computation signal Sa2 with the second harmonic component reduced as compared with the third and fourth signals S3 and S4.

The above discussion on PH6 applies also to PH5 and PH7. More specifically, if PH5 is greater than 150° and smaller than 210°, the absolute value of the amplitude of the second harmonic component Sa12 of the first post-computation signal Sa1 is smaller than the absolute value |p| of the amplitude of the second harmonic components of the first and second signals S1 and S2. When PH5 is 180°, in particular, the amplitude of the second harmonic component Sa12 is zero. Thus, the condition that PH5 is greater than 150° and smaller than 210° is a necessary condition for generating the first post-computation signal Sa1 with the second harmonic component reduced as compared with the first and second signals S1 and S2. Similarly, if PH7 is greater than 150° and smaller than 210°, the absolute value of the amplitude of the second harmonic component Sa32 of the third post-computation signal Sa3 is smaller than the absolute value |p| of the amplitude of the second harmonic components of the fifth and sixth signals S5 and S6. When PH7 is 180°, in particular, the amplitude of the second harmonic component Sa32 is zero. Thus, the condition that PH7 is greater than 150° and smaller than 210° is a necessary condition for generating the third post-computation signal Sa3 with the second harmonic component reduced as compared with the fifth and sixth signals S5 and S6.

Now, the reason why the first embodiment specifies that PH1, PH2, PH3 and PH4 are all greater than 40° and smaller than 80° will be described. Here, discussion will be made with reference to PH1 and PH3. To facilitate understanding, the following description assumes that PH5, PH6 and PH7 are all 180°. If PH1 is 40°, i.e., 2π/9, then PH3 is 40°, i.e., 2π/9, and the third harmonic components of the first and second signals S1 and S2 equal q·sin {3(θ−2π/9)} and q·sin {3(θ−2π/9−π)}, respectively. These expressions for the third harmonic components of the first and second signals S1 and S2 can be transformed into q·sin(3θ−2π/3) and −q·sin(3θ−2π/3), respectively. A computation similar to Equation (1C) determines that the third harmonic component Sa13 of the first post-computation signal Sa1 equals 2q·sin(3θ−2π/3). Further, from Equation (2C), it is determined that the third harmonic component Sa23 of the second post-computation signal Sa2 equals 2q·sin 3θ. Consequently, on the basis of Equation (4B), the third harmonic component Sa43 of the fourth post-computation signal Sa4 is expressed by Equation (8) below.

$$Sa43 = Sa13 + Sa23 \quad (8)$$
$$= 2q \cdot \sin(3\theta - 2\pi/3) + 2q \cdot \sin 3\theta$$
$$= 4q \cdot \sin(3\theta - \pi/3) \cdot \cos(-\pi/3)$$
$$= 2q \cdot \sin(3\theta - \pi/3)$$

If PH1 is 80°, i.e., 4π/9, then PH3 is 80°, i.e., 4π/9, and the third harmonic components of the first and second signals S1 and S2 equal q·sin {3(θ−4π/9)} and q·sin{3(θ−4π/9−π)}, respectively. These expressions for the third harmonic components of the first and second signals S1 and S2 can be transformed into q·sin(3θ−4π/3) and −q·sin(3θ−4π/3), respectively. A computation similar to Equation (1C) determines that the third harmonic component Sa13 of the first post-computation signal Sa1 equals 2q·sin(3θ−4π/3). Consequently, a computation similar to Equation (8) determines that the third harmonic component Sa48 of the fourth post-computation signal Sa4 equals −2q·sin(3θ−2π/3).

Thus, when PH1 and PH3 are both 40° or 80°, the absolute value of the amplitude of the third harmonic component Sa43 of the fourth post-computation signal Sa4 is |2q|, being equal to the absolute value |2q| of the amplitude of the third harmonic components Sa13 and Sa23 of the first and second post-computation signals Sa1 and Sa2. If PH1 and PH3 are both greater than 40° and smaller than 80°, the absolute value of the amplitude of the third harmonic component Sa43 of the fourth post-computation signal Sa4 is smaller than the absolute value |2q| of the amplitude of the third harmonic components Sa13 and Sa23. When PH1 and PH3 are both 60°, in particular, the amplitude of the third harmonic component Sa43 of the fourth post-computation signal Sa4 is zero. Thus, the condition that PH1 and PH3 are both greater than 40° and smaller than 80° is a necessary condition for generating the fourth post-computation signal Sa4 with the third harmonic component reduced as compared with the first and second post-computation signals Sa1 and Sa2.

The above discussion on PH1 and PH3 applies also to PH2 and PH4. More specifically, if PH2 and PH4 are both greater than 40° and smaller than 80°, the absolute value of the amplitude of the third harmonic component Sa53 of the fifth post-computation signal Sa5 is smaller than the absolute value |2q| of the amplitude of the third harmonic components Sa23 and Sa33 of the second and third post-computation signals Sa2 and Sa3. When PH2 and PH4 are both 60°, in particular, the amplitude of the third harmonic component Sa53 of the fifth post-computation signal Sa5 is zero. Thus, the condition that PH2 and PH4 are both greater than 40° and smaller than 80° is a necessary condition for generating the fifth post-computation signal Sa5 with the third harmonic component reduced as compared with the second and third post-computation signals Sa2 and Sa3.

As has been described, the rotating field sensor 1 according to the first embodiment includes the first to sixth signal generation units 14A, 14B, 24A, 24B, 34A and 34B configured to generate the first to sixth signals S1 to S6, respectively, and the angle detection unit 60 configured to generate the detected angle value θs based on the first to sixth signals S1 to S6. Each of the first to sixth signals S1 to S6 contains the ideal component, the second harmonic component and the third harmonic component. In the first embodiment, generated are the first post-computation signal Sa1 with the second harmonic component reduced as compared with the first and second signals S1 and S2, the second post-computation signal Sa2 with the second harmonic component reduced as compared with the third and fourth signals S3 and S4, and the third post-computation signal Sa3 with the second harmonic component reduced as compared with the fifth and sixth signals S6 and S6. Based on the first and second post-computation signals Sa1 and Sa2, generated is the fourth post-computation signal Sa4 with the third harmonic component reduced as compared with the first and second post-computation signals Sa1 and Sa2. Based on the second and third post-computation signals Sa2 and Sa3, generated is the fifth post-computation signal Sa5 with the third harmonic component reduced as compared with the second and third post-computation signals Sa2 and Sa3. Based on the fourth and fifth post-computation signals Sa4 and Sa5, the detected angle value θs is determined. The first embodiment thereby makes it possible to reduce an error in the detected angle value θs caused by the second and third harmonic components.

Figure 6:
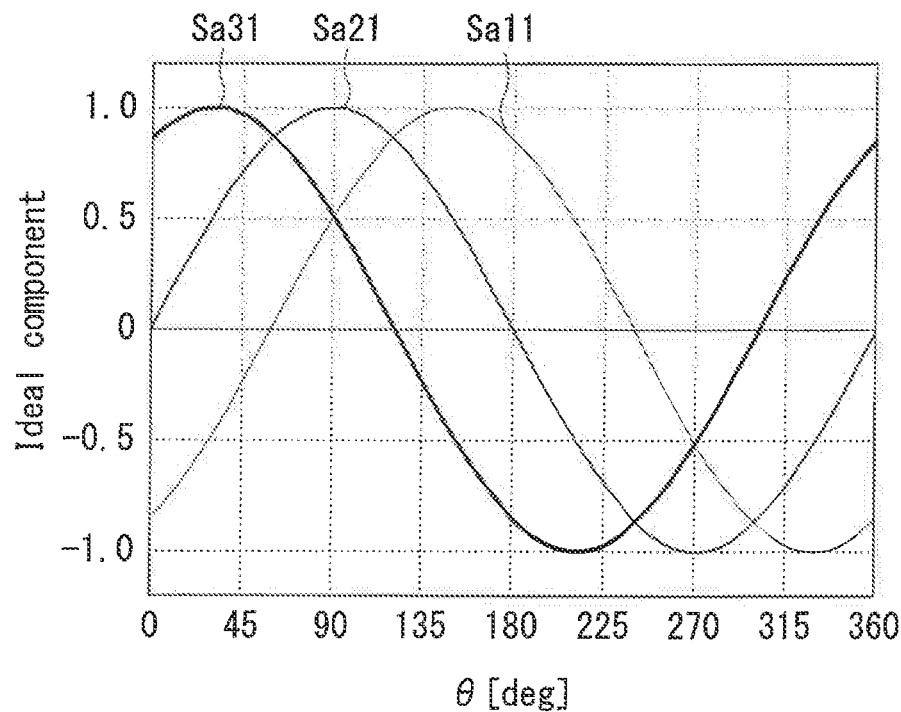
FIG. 6 is a waveform diagram illustrating an example of waveforms of respective ideal components of first to third post-computation signals of the first embodiment of the invention.

Now, error reduction in the detected angle value θs achieved by the first embodiment will be described with reference to actual measurement results. FIG. 6 is a waveform diagram illustrating the ideal components Sa11, Sa21 and Sa31 of the first to third post-computation signals Sa1 to Sa3. In FIG. 6, the horizontal axis represents angle θ, and the vertical axis represents the magnitude of the ideal components. In FIG. 6, the ideal components Sa11, Sa21 and Sa31 have been normalized to have a maximum value of 1 and a minimum value of −1.

Figure 7:
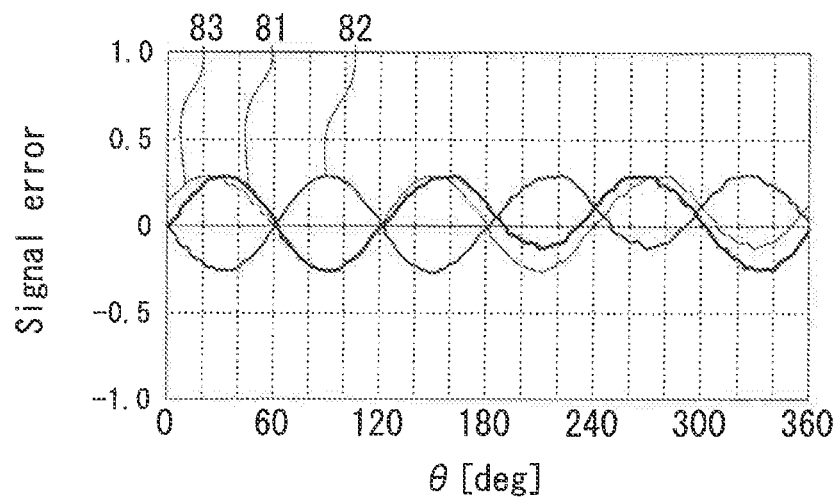
FIG. 7 is a waveform diagram illustrating an example of waveforms of signal errors contained in the first to third post-computation signals of the first embodiment of the invention.

FIG. 7 is a waveform diagram illustrating signal errors contained in the first to third post-computation signals Sa1 to Sa3. In FIG. 7, the horizontal axis represents angle θ, and the vertical axis represents the magnitude of the signal errors. The vertical axis is in arbitrary units. The waveform labeled 81 indicates the signal error contained in the first post-computation signal Sa1. The waveform labeled 82 indicates the signal error contained in the second post-computation signal Sa2. The waveform labeled 83 indicates the signal error contained in the third post-computation signal Sa3.

As shown in FIG. 7, the signal errors 81 to 83 have a major period of 120°, that is, ⅓ the period of the ideal components Sa11, Sa21 and Sa31. Therefore, as can be seen from FIG. 7, the major part of the signal error 81 of the first post-computation signal Sa1 is the third harmonic component Sa13 (see Equation (1)) of the first post-computation signal Sa1. This is because the second harmonic components of the first and second signals S1 and S2 cancel each other out when the first post-computation signal Sa1 is generated, as described previously. The signal error 81 shown in FIG. 7 contains the third harmonic component Sa13 where q in Equation (1C) is negative in value. Similarly, the major part of the signal error 82 of the second post-computation signal Sa2 is the third harmonic component Sa23 (see Equation (2C)) of the second post-computation signal Sa2. The signal error 82 shown in FIG. 7 contains the third harmonic component Sa23 where q in Equation (2C) is negative in value. Similarly, the major part of the signal error 83 of the third post-computation signal Sa3 is the third harmonic component Sa33 (see Equation (3C)) of the third post-computation signal Sa3. The signal error 83 shown in FIG. 7 contains the third harmonic component Sa33 where q in Equation (3C) is negative in value. The absolute value of the phase difference between the major part of the signal error 81 (the third harmonic component Sa13) and the major part of the signal error 82 (the third harmonic component Sa23), and the absolute value of the phase difference between the major part of the signal error 82 (the third harmonic component Sa23) and the major part of the signal error 83 (the third harmonic component Sa33) are both 60°, that is, ½ the period of the major parts of the signal errors 81 to 83.

In the first embodiment, the fourth post-computation signal Sa4 is generated by computation including determining the sum (Sa1+Sa2) of the first post-computation signal Sa1 and the second post-computation signal Sa2. When generating the fourth post-computation signal Sa4, the major part of the signal error 81 of the first post-computation signal Sa1 and the major part of the signal error 82 of the second post-computation signal Sa2 have opposite phases. Consequently, the third harmonic component Sa13, which is the major part of the signal error 81, and the third harmonic component Sa23, which is the major part of the signal error 82, cancel each other out. Similarly, the fifth post-computation signal Sa5 is generated by computation including determining the sum (Sa2+Sa3) of the second post-computation signal Sa2 and the third post-computation signal Sa3. When generating the fifth post-computation signal Sa5, the major part of the signal error 82 of the second post-computation signal Sa2 and the major part of the signal error 83 of the third post-computation signal Sa3 have opposite phases. Consequently, the third harmonic component Sa23, which is the major part of the signal error 82, and the third harmonic component Sa33, which is the major part of the signal error 83, cancel each other out.

Figure 8:
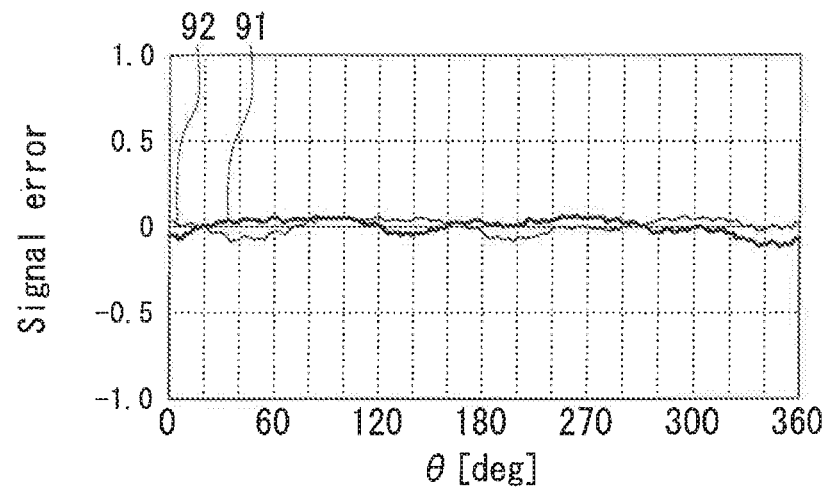
FIG. 8 is a waveform diagram illustrating an example of waveforms of signal errors contained in fourth and fifth post-computation signals of the first embodiment of the invention.

FIG. 8 is a waveform diagram illustrating signal errors contained in the fourth and fifth post-computation signals Sa4 and Sa5. In FIG. 8, the horizontal axis represents angle θ, and the vertical axis represents the magnitude of the signal errors. The vertical axis of FIG. 8 is in arbitrary units of the same basis as the vertical axis of FIG. 7. The waveform labeled 91 indicates the signal error contained in the fourth post-computation signal Sa4. The waveform labeled 92 indicates the signal error contained in the fifth post-computation signal Sa5. As shown in FIG. 8, the signal errors 91 and 92 of the fourth and fifth post-computation signals Sa4 and Sa5 are significantly smaller than the signal errors 81, 82 and 83 of the first to third post-computation signals Sa1, Sa2 and Sa3.

Figure 9:
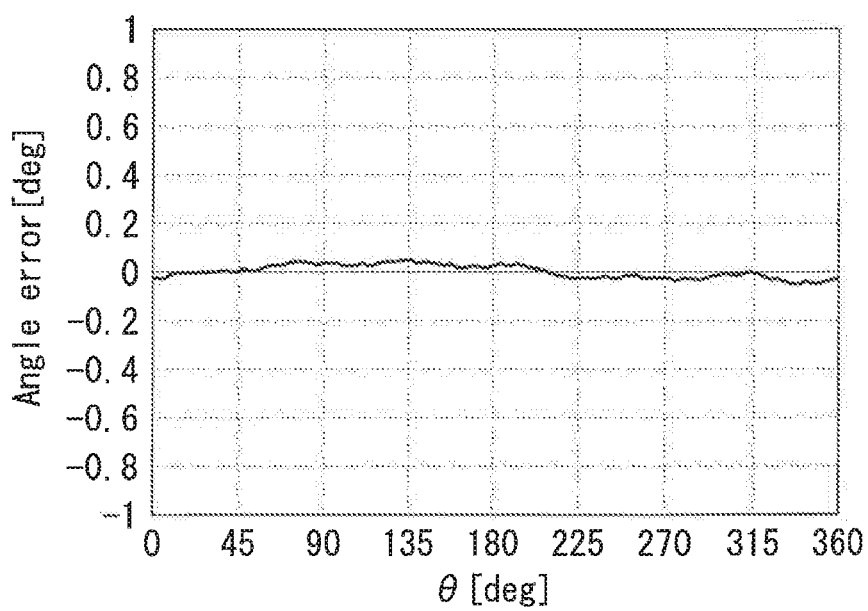
FIG. 9 is a waveform diagram illustrating an example of an angle error contained in a detected angle value in the first embodiment of the invention.

FIG. 9 is a characteristic diagram illustrating an angle error contained in the detected angle value θs determined based on the fourth and fifth post-computation signals Sa4 and Sa5 containing the signal errors shown in FIG. 8. The angle error refers to an error with respect to a theoretical value of the detected angle value θs that is expected when the direction DM of the rotating magnetic-field MF rotates ideally. In FIG. 9, the horizontal axis represents angle θ, and the vertical axis represents the magnitude of the angle error. FIG. 9 shows that the angle error is nearly zero.

The first embodiment thus allows the detected angle value θs to have a reduced error even when the first to sixth signals S1 to S6 contain the second and third harmonic components.

In the rotating field sensor 1 according to the first embodiment, the first to sixth signal generation units 14A, 14B, 24A, 24B, 34A and 34B can be constructed of three Wheatstone bridge circuits 14, 24 and 34. In this respect, the rotating field sensor 1 according to the first embodiment achieves downsizing and structure simplification when compared with the rotating field sensor described in U.S. Patent Application Publication No. 2012/0053865 A1, which includes four Wheatstone bridge circuits.

Second Embodiment

Figure 10:
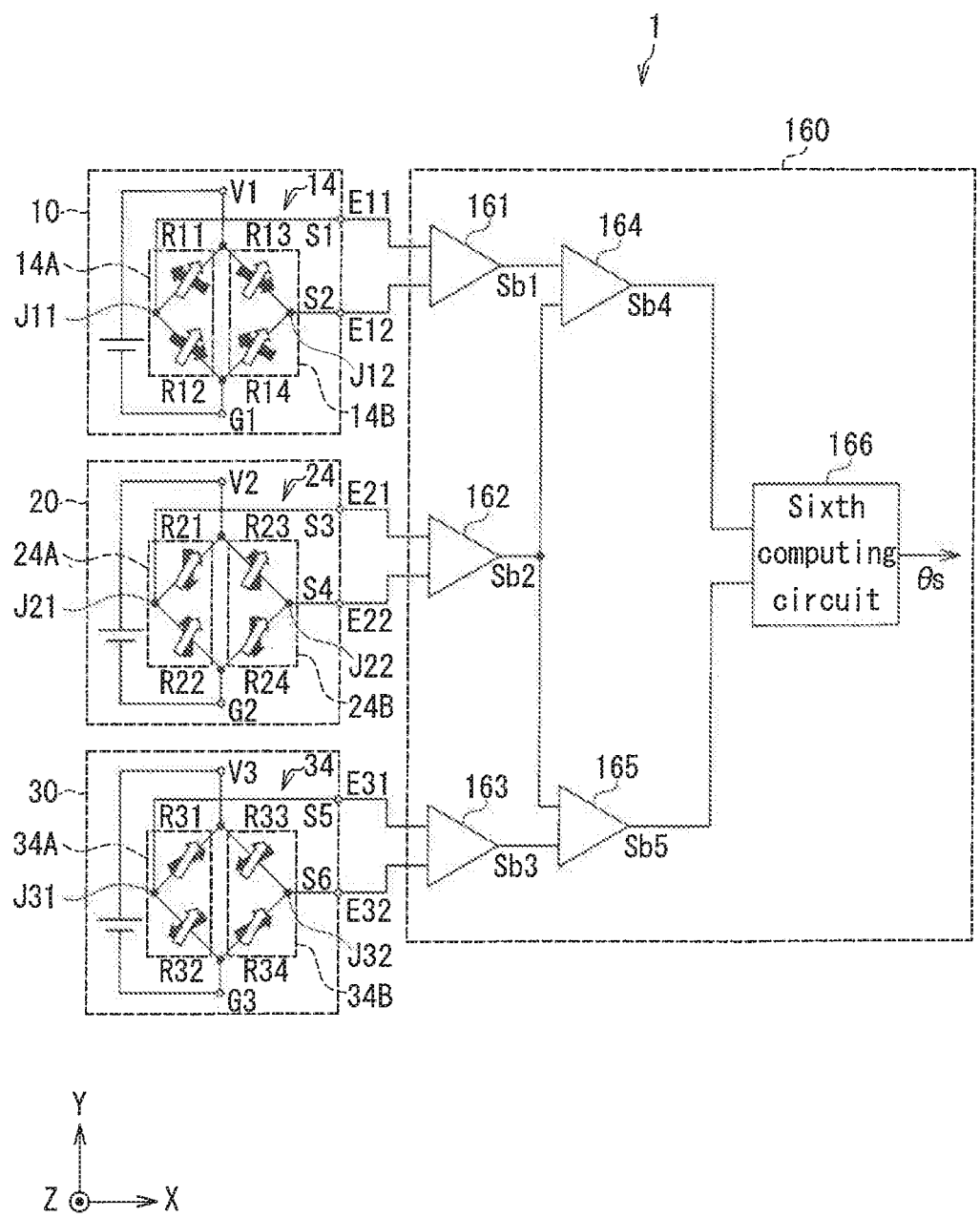
FIG. 10 is a circuit diagram illustrating the configuration of a rotating field sensor according to a second embodiment of the invention.

A rotating field sensor according to a second embodiment of the invention will now be described with reference to FIG. 10. FIG. 10 is a circuit diagram illustrating the configuration of the rotating field sensor according to the second embodiment. In the second embodiment, the first, second, fifth and sixth directions D1, D2, D5 and D6 are different from those of the first embodiment as described below.

The first direction D1, which is a direction of the rotating magnetic field MF that maximizes the first signal S1 generated by the first signal generation unit 14A, is the direction rotated clockwise by an angle θ1 greater than 100° and smaller than 140° from the third direction D3 (the −Y direction) of the first embodiment shown in FIG. 2. The fifth direction D5, which is a direction of the rotating magnetic field MF that maximizes the fifth signal S5 generated by the fifth signal generation unit 34A, is the direction rotated counterclockwise by an angle θ2 greater than 100° and smaller than 140° from the third direction D3.

The second direction D2, which is a direction of the rotating magnetic field MF that maximizes the second signal S2 generated by the second signal generation unit 14B, is the direction rotated clockwise by an angle θ3 greater than 100° and smaller than 140° from the fourth direction D4 (the Y direction) of the first embodiment shown in FIG. 2. The sixth direction D6, which is a direction of the rotating magnetic field MF that maximizes the sixth signal S6 generated by the sixth signal generation unit 34B, is the direction rotated counterclockwise by an angle θ4 greater than 100° and smaller than 140° from the fourth direction D4.

In the second embodiment, θ1 to θ4 are all preferably 120°. The following description will mainly discuss the case where θ1 to θ4 are all 120°. In this case, θ1+θ2 and θ3+θ4 are both 240°.

As shown in FIG. 10, the first to third detection circuits 10, 20 and 30 of the rotating field sensor 1 according to the second embodiment are configured basically in the same manner as the first embodiment. In the second embodiment, however, since the first, second, fifth and sixth directions D1, D2, D5 and D6 are different from those of the first embodiment as described above, the magnetization directions of the magnetization pinned layers of the plurality of MR elements in the first, second, fifth and sixth signal generation units 14A, 14B, 34A and 34B are different from those in the first embodiment.

In the second embodiment, the absolute value PH1 of the phase difference between the ideal component of the first signal S1 and the ideal component of the third signal S3, the absolute value PH2 of the phase difference between the ideal component of the third signal S3 and the ideal component of the fifth signal S5, the absolute value PH3 of the phase difference between the ideal component of the second signal S2 and the ideal component of the fourth signal S4, and the absolute value PH4 of the phase difference between the ideal component of the fourth signal S4 and the ideal component of the sixth signal S6 are different from those of the first embodiment. In the second embodiment, PH1, PH2, PH3 and PH4 are all greater than 100° and smaller than 140°. All of PH1, PH2, PH3 and PH4 are preferably 120°. The following description will mainly discuss the case where PH1, PH2, PH3 and PH4 are all 120°. In this case, PH1+PH2 and PH3+PH4 are both 240°.

The rotating field sensor 1 according to the second embodiment includes an angle detection unit 160 in place of the angle detection unit 60 of the first embodiment. Like the angle detection unit 60, the angle detection unit 160 is configured to generate a detected angle value θs based on the first to sixth signals S1 to S6, the detected angle value θs having a correspondence relationship with the angle θ that the direction DM of the rotating magnetic field MF in the reference position PR forms with respect to the reference direction DR. As shown in FIG. 10, the angle detection unit 160 includes a first computing circuit 161, a second computing circuit 162, a third computing circuit 163, a fourth computing circuit 164, a fifth computing circuit 165, and a sixth computing circuit 166.

Each of the first to sixth computing circuits 161 to 166 has two inputs and an output. The first to third computing circuits 161 to 163 are connected to the first to third detection circuits 10, 20 and 30 in the same connecting relationship as that of the first to third computing circuits 61 to 63 with the first to third detection circuits 10, 20 and 30 in the first embodiment. The first to third computing circuits 161 to 163 are connected to the fourth and fifth computing circuits 164 and 165 in the same connecting relationship as that of the first to third computing circuits 61 to 63 with the fourth and fifth computing circuits 64 and 65 in the first embodiment. The fourth and fifth computing circuits 164 and 165 are connected to the sixth computing circuit 166 in the same connecting relationship as that of the fourth and fifth computing circuits 64 and 65 with the sixth computing circuit 66 in the first embodiment.

The first computing circuit 161 receives the first and second signals S1 and S2 and generates a first post-computation signal Sb1 based on the first and second signals S1 and S2. The second computing circuit 162 receives the third and fourth signals S3 and S4 and generates a second post-computation signal Sb2 based on the third and fourth signals S3 and S4. The third computing circuit 163 receives the fifth and sixth signals S5 and 86 and generates a third post-computation signal Sb3 based on the fifth and sixth signals S5 and S6. The fourth computing circuit 164 receives the first and second post-computation signals Sb1 and Sb2 and generates a fourth post-computation signal Sb4 based on the first and second post-computation signals Sb1 and Sb2. The fifth computing circuit 165 receives the second and third post-computation signals Sb2 and Sb3 and generates a fifth post-computation signal Sb5 based on the second and third post-computation signals Sb2 and Sb3. The sixth computing circuit 166 receives the fourth and fifth post-computation signals Sb4 and Sb5 and determines the detected angle value θs based on the fourth and fifth post-computation signals Sb4 and Sb5.

The first to sixth computing circuits 161 to 166 can be implemented by a single microcomputer, for example.

A method for determining the detected angle value θs in the second embodiment will now be described. To begin with, how to generate the first to third post-computation signals Sb1 to Sb3 will be described. In the second embodiment, the ideal components of the first, second, fifth and sixth signals S1, S2, S5 and S6 are expressed as $\sin(\theta-2\pi/3)$, $\sin(\theta-2\pi/3-\pi)$, $\sin(\theta+2\pi/3)$, and $\sin(\theta+2\pi/3-\pi)$, respectively. The above expressions for the ideal components of the signals S2 and S6 can be transformed into $-\sin(\theta-2\pi/3)$ and $-\sin(\theta+2\pi/3)$, respectively. A computation similar to Equation (1A) of the first embodiment determines that the ideal component Sb11 of the first post-computation signal Sb1 equals $2\sin(\theta-2\pi/3)$. A computation similar to Equation (3A) of the first embodiment determines that the ideal component Sb31 of the third post-computation signal Sb3 equals $2\sin(\theta+2\pi/3)$. The ideal components of the third and fourth signals S3 and S4 are the same as those of the first embodiment, and the ideal component Sb21 of the second post-computation signal Sb2 equals $2\sin\theta$.

The second harmonic components of the first, second, fifth and sixth signals S1, S2, S5 and S6 can be expressed as $p\cdot\sin\{2(\theta-2\pi/3)\}$, $p\cdot\sin\{2(\theta-2\pi/3-\pi)\}$, $p\cdot\sin\{2(\theta+2\pi/3)\}$, and $p\cdot\sin\{2(\theta+2\pi/3-\pi)\}$, respectively.

Transforming these expressions results in that the second harmonic components of the first and second signals S1 and S2 each equal $p\cdot\sin(2\theta-4\pi/3)$, and the second harmonic components of the fifth and sixth signals S5 and S6 each equal $p\cdot\sin(2\theta+4\pi/3)$. A computation similar to Equation (1B) of the first embodiment determines that the second harmonic component Sb12 of the first post-computation signal Sb1 is zero. A computation similar to Equation (3B) of the first embodiment determines that the second harmonic component Sb32 of the third post-computation signal Sb3 is zero. The second harmonic components of the third and fourth signals S3 and S4 are the same as those of the first embodiment, and the second harmonic component Sb22 of the second post-computation signal Sb2 is zero.

The third harmonic components of the first, second, fifth and sixth signals S1, S2, S5 and S6 can be expressed as $q\cdot\sin\{3(\theta-2\pi/3)\}$, $q\cdot\sin\{3(\theta-2\pi/3-\pi)\}$, $q\cdot\sin\{3(\theta+2\pi/3)\}$, and $q\cdot\sin\{3(\theta+2\pi/3-7)\}$, respectively.

Transforming these expressions results in that the third harmonic components of the first and fifth signals S1 and S5 each equal $q\cdot\sin 3\theta$, and the third harmonic components of the second and sixth signals S2 and S6 each equal $-q^*\sin 3\theta$. A computation similar to Equation (1C) of the first embodiment determines that the third harmonic component Sb13 of the first post-computation signal Sb1 equals $2q\cdot\sin 3\theta$. A computation similar to Equation (3C) of the first embodiment determines that the third harmonic component Sb33 of the third post-computation signal Sb3 equals $2q\cdot\sin 3\theta$. The third harmonic components of the third and fourth signals S3 and S4 are the same as those of the first embodiment, and the third harmonic component Sb23 of the second post-computation signal Sb2 equals $2q\cdot\sin 3\theta$.

Like the first computing circuit 61 of the first embodiment, the first computing circuit 161 of the second embodiment generates, based on the first and second signals S1 and S2, the first post-computation signal Sb1 with the second harmonic component reduced as compared with the first and second signals S1 and S2. Like the second computing circuit 62 of the first embodiment, the second computing circuit 162 generates, based on the third and fourth signals S3 and S4, the second post-computation signal Sb2 with the second harmonic component reduced as compared with the third and fourth signals S3 and S4. Like the third computing circuit 63 of the first embodiment, the third computing circuit 163 generates, based on the fifth and sixth signals S5 and S6, the third post-computation signal Sb3 with the second harmonic component reduced as compared with the fifth and sixth signals S5 and S6.

Now, how to generate the fourth and fifth post-computation signals Sb4 and Sb5 will be described. In the second embodiment, the fourth post-computation signal Sb4 is generated by computation including determining the difference between the first post-computation signal Sb1 and the second poet-computation signal Sb2. Determining the difference between the first post-computation signal Sb1 and the second post-computation signal Sb2 allows the ideal component Sb41 and the third harmonic component Sb43 of the fourth post-computation signal Sb4 to be expressed by the following Equations (9A) and (9B), respectively. Note that since the second harmonic component Sb12 of the first post-computation signal Sb1 and the second harmonic component Sb22 of the second post-computation signal Sb2 are both zero, the fourth post-computation signal Sb4 contains no second harmonic component.

$$\begin{aligned}Sb41 &= Sb11 - Sb21 \\ &= 2\sin(\theta - 2\pi/3) - 2\sin\theta \\ &= 4\sin(-\pi/3)\cdot\cos(\theta - \pi/3) \\ &= -3.46\cos(\theta - \pi/3)\end{aligned} \quad (9A)$$

$$\begin{aligned}Sb43 &= Sb13 - Sb23 \\ &= 2q\cdot\sin 3\theta - 2q\cdot\sin 3\theta \\ &= 0\end{aligned} \quad (9B)$$

As can be seen from Equation (9B), in the second embodiment, the third-harmonic component Sb13 of the first post-computation signal Sb1 and the third harmonic component Sb23 of the second post-computation signal Sb2 cancel each other out completely when the fourth post-computation signal Sb4 is generated. Thus, the third harmonic component Sb43 of the fourth post-computation signal Sb4 is zero. As will be described later, the absolute value of the amplitude of the third harmonic component Sb43 of the fourth post-computation signal Sb4 is smaller than the absolute value |2q| of the amplitude of the third harmonic components Sb13 and Sb23 of the first and second post-computation signals Sb1 and Sb2 not only when PH1 and PH3 are both 120° but as long as PH1 and PH3 are both greater than 100° and smaller than 140°. In this manner, the fourth computing circuit 164 generates, based on the first and second post-computation signals Sb1 and Sb2, the fourth post-computation signal Sb4 with the third harmonic component reduced as compared with the first and second post-computation signals Sb1 and Sb2.

Further, in the second embodiment, the fifth post-computation signal Sb5 is generated by computation including determining the difference between the second post-computation signal Sb2 and the third post-computation signal Sb3. Determining the difference between the second post-computation signal Sb2 and the third post-computation signal Sb3 allows the ideal component Sb51 and the third harmonic component Sb53 of the fifth post-computation signal Sb5 to be expressed by the following Equations (10A) and (10B), respectively. Note that since the second harmonic component Sb22 of the second post-computation signal Sb2 and the second harmonic component Sb32 of the third post-computation signal Sb3 are both zero, the fifth post-computation signal Sb5 contains no second harmonic component.

$$\begin{aligned} Sb51 &= Sb21 - Sb31 \\ &= 2\sin\theta - 2\sin(\theta + 2\pi/3) \\ &= 4\sin(-\pi/3)\cdot\cos(\theta + \pi/3) \\ &= -3.46\cos(\theta + \pi/3) \end{aligned} \quad (10A)$$

$$\begin{aligned} Sb53 &= Sb23 - Sb33 \\ &= 2q\cdot\sin3\theta - 2q\cdot\sin3\theta \\ &= 0 \end{aligned} \quad (10B)$$

As can be seen from Equation (10B), in the second embodiment, the third harmonic component Sb23 of the second post-computation signal Sb2 and the third harmonic component Sb33 of the third post-computation signal Sb3 cancel each other out completely when the fifth post-computation signal Sb5 is generated. Thus, the third harmonic component Sb53 of the fifth post-computation signal Sb5 is zero. As is the case with the third harmonic component Sb43 of the fourth post-computation signal Sb4, the absolute value of the amplitude of the third harmonic component Sb53 of the fifth post-computation signal Sb5 is smaller than the absolute value |2q| of the amplitude of the third harmonic components Sb23 and Sb33 of the second and third post-computation signals Sb2 and Sb3 not only when PH2 and PH4 are both 120° but as long as PH2 and PH4 are both greater than 100° and smaller than 140°. In this manner, the fifth computing circuit 165 generates, based on the second and third post-computation signals Sb2 and Sb3, the fifth post-computation signal Sb5 with the third harmonic component reduced (s compared with the second and third post-computation signals Sb2 and Sb3.

The configuration of the sixth computing circuit 166 and how the sixth computing circuit 166 determines the detected angle value θs will now be described. The sixth computing circuit 166 is configured in the same manner as the sixth computing circuit 66 of the first embodiment. More specifically, the sixth computing circuit 166 includes the normalization circuits N1, N2, N3 and N4, the adder circuit 66A, the subtractor circuit 66B, and the computing unit 66C shown in FIG. 4 and described in the first embodiment section.

In the second embodiment, the detected angle value θ is determined basically in the same manner as the first embodiment. In the second embodiment, from Equations (9A) and (9B), the normalized value of the fourth post-computation signal Sb4 is −cos(θ−π/3). From Equations (10A) and (10B), the normalized value of the fifth post-computation signal Sb5 is −cos(θ+π/3). A computation similar to Equation (6A) of the first embodiment determines that the addition signal S11 generated by the adder circuit 66A in the second embodiment equals −cos θ. A computation similar to Equation (6B) of the first embodiment determines that the subtraction signal S12 generated by the subtractor circuit 66B in the second embodiment equals −1.73 sin θ.

In the second embodiment, the normalized value S21 of the addition signal S11 is −cos θ, and the normalized value S22 of the subtraction signal S12 is −sin θ. The computing unit 66C of the second embodiment determines the detected angle value θs having a correspondence relationship with the angle θ by Equation (11A) below, for example.

$$\theta s = a\tan(S22/S21) \quad (11A)$$

The term "a tan(S22/S21)" of Equation (11A) represents the arctangent calculation for determining θs. For θs in the range of 0° (inclusive) to 360° (exclusive), there are two solutions of θs in Equation (11A) with a difference of 180° in value. Which of the two solutions of θs in Equation (11A) is the true value of θs can be determined from the combination of positive and negative signs on S21 and S22. More specifically, if S21 is positive in value, θs is greater than 90° and smaller than 270°. If S21 is negative in value, θs is between 0° (inclusive) and 90° (exclusive), and between 270° (exclusive) and 360° (inclusive). If S22 is positive in value, θs is greater than 180° and smaller than 360°. If S22 is negative in value, θs is greater than 0° and smaller than 180°. Using Equation (11A) and based on the foregoing determination made with the combination of positive and negative signs on S21 and S22, the computing unit 66C determines θs within the range of 0° (inclusive) to 360° (exclusive).

The computing unit 66C may determine the detected angle value θs in the following manner. First, the computing unit 66C determines at least one first candidate for the detected angle value θs by Equation (11B) below.

$$\theta s = a\cos(-S21) \quad (11B)$$

S21 takes on a single value for two different values of θ falling within the range of 0° (inclusive) to 360° (exclusive) except when S21 is maximum or minimum in value. Thus, according to the above-described method, two first candidates for the detected angle value θs are obtained for a single value of S21 in most cases.

Next, the computing unit 66C determines at least one second candidate for the detected angle value θs by Equation (11C) below.

$$\theta s = a\sin(-S22) \quad (11C)$$

As with Equation (11B), two second candidates for the detected angle value θs are obtained for a single value of S22 in most cases. If there exists a pair of first and second candidates identical with each other, the computing unit 66C takes the identical first and second candidates as the detected angle value θs. If there exists a pair of first and second candidates not identical with but very close to each other, the computing unit 66C takes the first candidate in that pair as the detected angle value θs.

Now, the reason why the second embodiment specifies that PH1, PH2, PH3 and PH4 are all greater than 100° and smaller than 140° will be described. Here, discussion will be made with reference to PH1 and PH3. To facilitate understanding, the following description assumes that the absolute value PH5 of the phase difference between the ideal component of the first signal S1 and the ideal component of the second signal S2, the absolute value PH6 of the phase difference between the ideal component of the third signal S3 and the ideal component of the fourth signal S4, and the absolute value PH7 of the phase difference between the ideal component of the fifth signal S5 and the ideal component of the sixth signal S6 are all 180°. If PH1 is 100°, i.e., 5π/9, then PH3 is 100°, i.e., 5π/9, and the third harmonic components of the first and second signals S1 and S2 equal q·sin{3(θ−5π/9)} and q·sin{3(θ−5π/9−π)}, respectively. These expressions for the third harmonic components of the first and second signals S1 and S2 can be transformed into q·sin(3θ−5π/3) and −q·sin(3θ−5π/3), respectively. A computation similar to Equation (1C) of the first embodiment determines that the third harmonic component Sb13 of the first post-computation signal Sb1 equals 2q·sin(3θ−5π/3). Further, from Equation (2C) of the first embodiment, it is determined that the third harmonic component Sb23 of the second post-computation signal Sb2 equals 2q·sin 3θ. Consequently, on the basis of Equation (9B), the third harmonic component Sb43 of the fourth post-computation signal Sb4 is expressed by Equation (12) below.

$$\begin{aligned} Sb43 &= Sb13 - Sb23 \\ &= 2q \cdot \sin(3\theta - 5\pi/3) - 2q \cdot \sin 3\theta \\ &= 4q \cdot \sin(-5\pi/6) \cdot \cos(3\theta - 5\pi/6) \\ &= -2q \cdot \cos(3\theta - 5\pi/6) \end{aligned} \quad (12)$$

If PH1 is 140°, i.e., 7π/9, then PH3 is 140°, i.e., 7π/9, and the third harmonic components of the first and second signals S1 and S2 equal q·sin {3(θ−7π/9)} and q·sin {3(θ−7π/9−π)}, respectively. These expressions for the third harmonic components of the first and second signals S1 and S2 can be transformed into q·sin(3θ−7π/3) and −q·sin(3θ−7π/3), respectively. A computation similar to Equation (1C) of the first embodiment determines that the third harmonic component Sb13 of the first post-computation signal Sb1 equals 2q·sin(3θ−7π/3). Consequently, a computation similar to Equation (12) determines that the third harmonic component Sb43 of the fourth post-computation signal Sb4 equals 2q·cos(3θ−7π/6).

Thus, when PH1 and PH3 are both 100° or 140°, the absolute value of the amplitude of the third harmonic component Sb43 of the fourth post-computation signal Sb4 is |2q|, being equal to the absolute value |2q| of the amplitude of the third harmonic components Sb13 and Sb23 of the first and second post-computation signals Sb1 and Sb2. If PH1 and PH3 are both greater than 100° and smaller than 140°, the absolute value of the amplitude of the third harmonic component Sb43 of the fourth post-computation signal Sb4 is smaller than the absolute value |2q| of the amplitude of the third harmonic components Sb13 and Sb23. When PH1 and PH3 are both 120°, in particular, the amplitude of the third harmonic component Sb43 of the fourth post-computation signal Sb4 is zero. Thus, the condition that PH1 and PH3 are both greater than 100° and smaller than 140° is a necessary condition for generating the fourth post-computation signal Sb4 with the third harmonic component reduced as compared with the first and second post-computation signals Sb1 and Sb2.

The above discussion on PH1 and PH3 applies also to PH2 and PH4. More specifically, if PH2 and PH4 are both greater than 100° and smaller than 140°, the absolute value of the amplitude of the third harmonic component Sb53 of the fifth post-computation signal Sb5 is smaller than the absolute value |2q| of the amplitude of the third harmonic components Sb23 and Sb33 of the second and third post-computation signals Sb2 and Sb3. When PH2 and PH4 are both 120°, in particular, the amplitude of the third harmonic component Sb53 of the fifth post-computation signal Sb5 is zero. Thus, the condition that PH2 and PH4 are both greater than 100° and smaller than 140° is a necessary condition for generating the fifth post-computation signal Sb5 with the third harmonic component reduced as compared with the second and third post-computation signals Sb2 and Sb3.

The other configuration, operation, and effects of the second embodiment are the same as those of the first embodiment.

Third Embodiment

Figure 11:
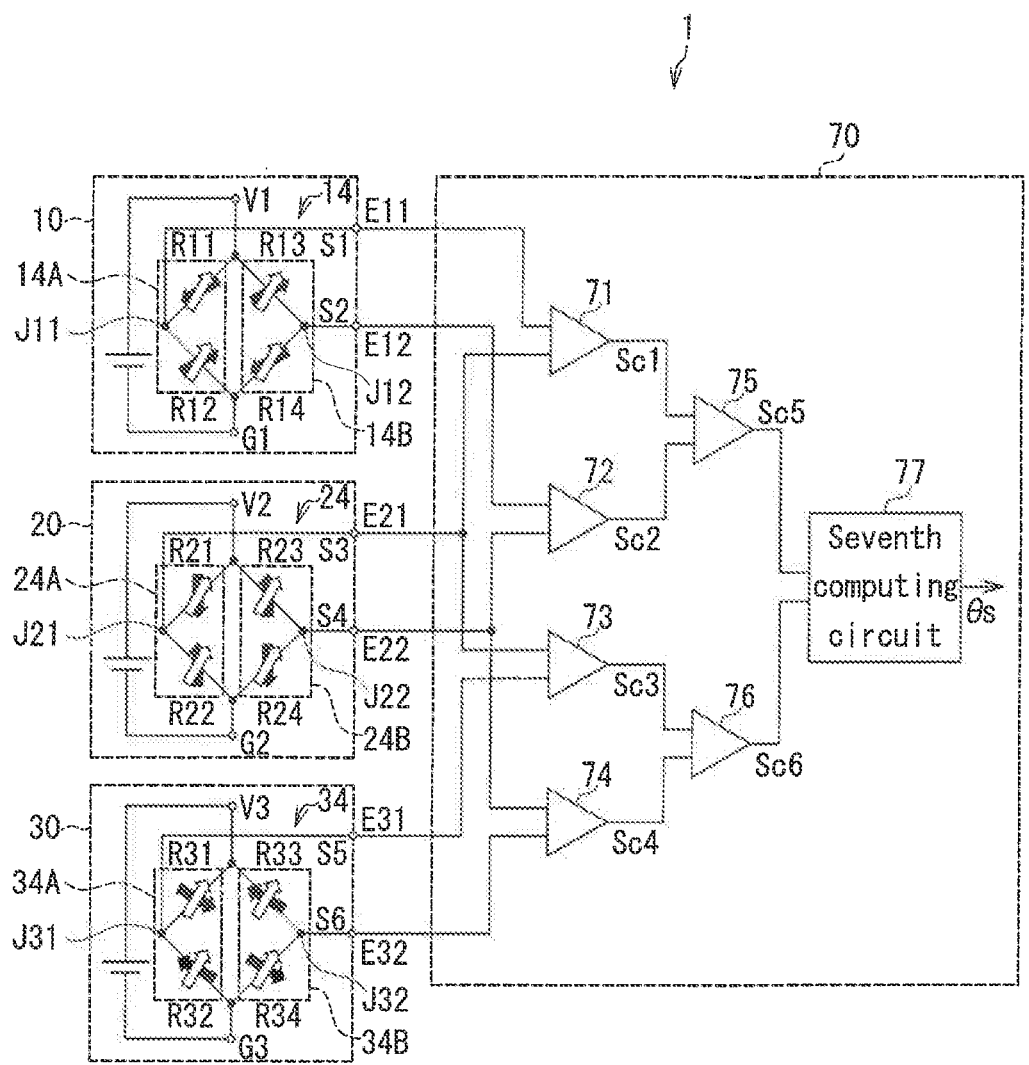
FIG. 11 is a circuit diagram illustrating the configuration of a rotating field sensor according to a third embodiment of the invention.

A rotating field sensor according to a third embodiment of the invention will now be described with reference to FIG. 11. FIG. 11 is a circuit diagram illustrating the configuration of the rotating field sensor according to the third embodiment. In the third embodiment, the first to third detection circuits 10, 20 and 30 of the rotating field sensor 1 are configured in the same manner as the first embodiment. The rotating field sensor 1 according to the third embodiment includes an angle detection unit 70 in place of the angle detection unit 60 of the first embodiment. Like the angle detection unit 60, the angle detection unit 70 is configured to generate a detected angle value θs based on the first to sixth signals S1 to S6, the detected angle value θs having a correspondence relationship with the angle θ that the direction DM of the rotating magnetic field MF in the reference position PR forms with respect to the reference direction DR. As shown in FIG. 11, the angle detection unit 70 includes a first computing circuit 71, a second computing circuit 72, a third computing circuit 73, a fourth computing circuit 74, a fifth computing circuit 75, a sixth computing circuit 76, and a seventh computing circuit 77.

Each of the first to seventh computing circuits 71 to 77 has a first input, a second input, and an output. The first and second inputs of the first computing circuit 71 are connected to the output ports E11 and E21, respectively. The first and second inputs of the second computing circuit 72 are connected to the output ports E12 and E22, respectively. The first and second inputs of the third computing circuit 73 are connected to the output ports E21 and E31, respectively. The first and second inputs of the fourth computing circuit 74 are connected to the output ports E22 and E32, respectively. The first and second inputs of the fifth computing circuit 75 are connected to the outputs of the first and second computing circuits 71 and 72, respectively. The first and second inputs of the sixth computing circuit 76 are connected to the outputs of the third and fourth computing circuits 73 and 74, respectively. The first and second inputs of the seventh computing circuit 77 are connected to the outputs of the fifth and sixth computing circuits 75 and 76, respectively.

The first computing circuit 71 receives the first and third signals S1 and S3 and generates a first post-computation signal Sc1 based on the first and third signals S1 and S3. The second computing circuit 72 receives the second and fourth signals S2 and S4 and generates a second post-computation signal Sc2 based on the second and fourth signals S2 and S4. The third computing circuit 73 receives the third and fifth signals S3 and S5 and generates a third post-computation signal Sc3 based on the third and fifth signals S3 and S5. The fourth computing circuit 74 receives the fourth and sixth signals S4 and S6 and generates a fourth post-computation signal Sc4 based on the fourth and sixth signals S4 and S6. The fifth computing circuit 75 receives the first and second post-computation signals Sc1 and Sc2 and generates a fifth post-computation signal Sc5 based on the first and second post-computation signals Sc1 and Sc2. The sixth computing circuit 76 receives the third and fourth post-computation signals Sc3 and Sc4 and generates a sixth post-computation signal Sc6 based on the third and fourth post-computation signals Sc3 and Sc4. The seventh computing circuit 77 receives the fifth and sixth post-computation signals Sc5 and Sc6 and determines the detected angle value θs based on the fifth and sixth post-computation signals Sc5 and Sc6.

The first to seventh computing circuits 71 to 77 can be implemented by a single microcomputer, for example.

A method for determining the detected angle value θs will now be described. To begin with, how to generate the first to fourth post-computation signals Sc1 to Sc4 will be described. The ideal components, the second harmonic components, and the third harmonic components of the first to sixth signals S1 to S6 in the third embodiment are the same as those in the first embodiment. In the third embodiment, the first post-computation signal Sc1 is generated by computation including determining the sum (S1+S3) of the first signal S1 and the third signal S3. Determining the sum (S1+S3) of the first signal S1 and the third signal S3 allows the ideal component Sc11, the second harmonic component Sc12, and the third harmonic component Sc13 of the first post-computation signal Sc1 to be expressed by the following Equations (13A), (13B), and (13C), respectively.

$$Sc11 = \sin(\theta - \pi/3) + \sin\theta \quad (13A)$$
$$= 2\sin(\theta - \pi/6) \cdot \cos(-\pi/6)$$
$$= 1.73\sin(\theta - \pi/6)$$

$$Sc12 = p \cdot \sin(2\theta - 2\pi/3) + p \cdot \sin 2\theta \quad (13B)$$
$$= 2p \cdot \sin(2\theta - \pi/3) \cdot \cos(-\pi/3)$$
$$= p \cdot \sin(2\theta - \pi/3)$$

$$Sc13 = -q \cdot \sin 3\theta + q \cdot \sin 3\theta \quad (13C)$$
$$= 0$$

As can be seen from Equation (13C), in the third embodiment, the third harmonic component of the first signal S1 and the third harmonic component of the third signal S3 cancel each other out completely when the first post-computation signal Sc1 is generated. Thus, the third harmonic component Sc13 of the first post-computation signal Sc1 is zero. As in the first embodiment, the absolute value of the amplitude of the third harmonic component Sc13 of the first post-computation signal Sc1 is smaller than the absolute value |q| of the amplitude of the third harmonic components of the first and third signals S1 and S3 not only when PH1 is 60° but as long as PH1 is greater than 40° and smaller than 80°. In this manner, the first computing circuit 71 generates, based on the first and third signals S1 and S3, the first post-computation signal Sc1 with the third harmonic component reduced as compared with the first and third signals S1 and S3.

In the third embodiment, the second post-computation signal Sc2 is generated by computation including determining the sum (S2+S4) of the second signal S2 and the fourth signal S4. Determining the sum (S2+S4) of the second signal S2 and the fourth signal S4 allows the ideal component Sc21, the second harmonic component Sc22, and the third harmonic component Sc23 of the second post-computation signal Sc2 to be expressed by the following Equations (14A), (14B), and (14C), respectively.

$$Sc21 = -\sin(\theta - \pi/3) + \{-\sin\theta\} \quad (14A)$$
$$= -2\sin(\theta - \pi/6) \cdot \cos(-\pi/6)$$
$$= -1.73\sin(\theta - \pi/6)$$

$$Sc22 = p \cdot \sin(2\theta - 2\pi/3) + p \cdot \sin 2\theta \quad (14B)$$
$$= 2p \cdot \sin(2\theta - \pi/3) \cdot \cos(-\pi/3)$$
$$= p \cdot \sin(2\theta - \pi/3)$$

$$Sc23 = q \cdot \sin 3\theta + (-q \cdot \sin 3\theta) \quad (14C)$$
$$= 0$$

As can be seen from Equation (14C), in the third embodiment, the third harmonic component of the second signal S2 and the third harmonic component of the fourth signal S4 cancel each other out completely when the second post-computation signal Sc2 is generated. Thus, the third harmonic component Sc23 of the second post-computation signal Sc2 is zero. As in the first embodiment, the absolute value of the amplitude of the third harmonic component Sc23 of the second post-computation signal Sc2 is smaller than the absolute value |q| of the amplitude of the third harmonic components of the second and fourth signals S2 and S4 not only when PH3 is 60° but as long as PH3 is greater than 40° and smaller than 80°. In this manner, the second computing circuit 72 generates, based on the second and fourth signals S2 and S4, the second post-computation signal Sc2 with the third harmonic component reduced as compared with the second and fourth signals S2 and S4.

In the third embodiment, the third post-computation signal Sc3 is generated by computation including determining the sum (S3+S5) of the third signal S3 and the fifth signal S5. Determining the sum (S3+S5) of the third signal S3 and the fifth signal S5 allows the ideal component Sc31, the second harmonic component Sc32, and the third harmonic component Sc33 of the third post-computation signal Sc3 to be expressed by the following Equations (15A), (15B), and (15C), respectively.

$$Sc31 = \sin\theta + \sin(\theta + \pi/3) \quad (15A)$$
$$= 2\sin(\theta + \pi/6) \cdot \cos(-\pi/6)$$
$$= 1.73\sin(\theta + \pi/6)$$

$$Sc32 = p \cdot \sin 2\theta + p \cdot \sin(2\theta + 2\pi/3) \quad (15B)$$
$$= 2p \cdot \sin(2\theta + \pi/3) \cdot \cos(-\pi/3)$$
$$= p \cdot \sin(2\theta + \pi/3)$$

$$Sc33 = q \cdot \sin 3\theta + (-q \cdot \sin 3\theta) \quad (15C)$$
$$= 0$$

As can be seen from Equation (15C), in the third embodiment, the third harmonic component of the third signal S3 and the third harmonic component of the fifth signal S5 cancel each other out completely when the third post-computation signal Sc3 is generated. Thus, the third harmonic component Sc33 of the third post-computation signal Sc3 is zero. As in the first embodiment, the absolute value of the amplitude of the third harmonic component Sc33 of the third post-computation signal Sc3 is smaller than the absolute value |q| of the amplitude of the third harmonic components of the third and fifth signals S3 and S5 not only when PH2 is 60° but as long as PH2 is greater than 40° and smaller than 80°. In this manner, the third computing circuit 73 generates, based on the third and fifth signals S3 and 5, the third post-computation signal Sc3 with the third harmonic component reduced as compared with the third and fifth signals S3 and S5.

In the third embodiment, the fourth post-computation signal Sc4 is generated by computation including determining the sum (S4+S6) of the fourth signal S4 and the sixth signal S6. Determining the sum (S4+S6) of the fourth signal S4 and the sixth signal S6 allows the ideal component Sc41, the second harmonic component Sc42, and the third harmonic component Sc43 of the fourth post-computation signal Sc4 to be expressed by the following Equations (16A), (16B), and (16C), respectively.

$$Sc41 = -\sin\theta + \{-\sin(\theta + \pi/3)\} \quad (16A)$$
$$= -2\sin(\theta + \pi/6) \cdot \cos(-\pi/6)$$
$$= -1.73\sin(\theta + \pi/6)$$

$$Sc42 = p \cdot \sin2\theta + p \cdot \sin(2\theta + 2\pi/3) \quad (16B)$$
$$= 2p \cdot \sin(2\theta + \pi/3) \cdot \cos(-\pi/3)$$
$$= p \cdot \sin(2\theta + \pi/3)$$

$$Sc43 = -q \cdot \sin3\theta + q \cdot \sin3\theta \quad (16C)$$
$$= 0$$

As can be seen from Equation (16C), in the third embodiment, the third harmonic component of the fourth signal S4 and the third harmonic component of the sixth signal S6 cancel each other out completely when the fourth post-computation signal Sc4 is generated. Thus, the third harmonic component Sc43 of the fourth post-computation signal Sc4 is zero. As in the first embodiment, the absolute value of the amplitude of the third harmonic component Sc43 of the fourth post-computation signal Sc4 is smaller than the absolute value $|q|$ of the amplitude of the third harmonic components of the fourth and sixth signals S4 and S6 not only when PH4 is 60° but as long as PH4 is greater than 40° and smaller than 80°. In this manner, the fourth computing circuit 74 generates, based on the fourth and sixth signals S4 and S6, the fourth post-computation signal Sc4 with the third harmonic component reduced as compared with the fourth and sixth signals S4 and S6.

Next, how to generate the fifth and sixth post-computation signals Sc5 and Sc6 will be described. In the third embodiment, the fifth post-computation signal Sc5 is generated by computation including determining the difference between the first post-computation signal Sc1 and the second post-computation signal Sc2. Determining the difference between the first post-computation signal Sc1 and the second post-computation signal Sc2 allows the ideal component Sc51 and the second harmonic component Sc52 of the fifth post-computation signal Sc5 to be expressed by the following Equations (17A) and (17B), respectively. Note that since the third harmonic component Sc13 of the first post-computation signal Sc1 and the third harmonic component Sc23 of the second post-computation signal Sc2 are both zero, the fifth post-computation signal Sc5 contains no third harmonic component.

$$Sc51 = Sc11 - Sc21 \quad (17A)$$
$$= 1.73\sin(\theta - \pi/6) - \{-1.73\sin(\theta - \pi/6)\}$$
$$= 3.46\sin(\theta - \pi/6)$$

$$Sc52 = Sc12 - Sc22 \quad (17B)$$
$$= p \cdot \sin(2\theta - \pi/3) - p \cdot \sin(2\theta - \pi/3)$$
$$= 0$$

As can be seen from Equation (17B), in the third embodiment, the second harmonic component Sc12 of the first post-computation signal Sc1 and the second harmonic component Sc22 of the second post-computation signal Sc2 cancel each other out completely when the fifth post-computation signal Sc5 is generated. Thus, the second harmonic component Sc52 of the fifth post-computation signal Sc5 is zero. As in the first embodiment, the absolute value of the amplitude of the second harmonic component Sc52 of the fifth post-computation signal Sc5 is smaller than the absolute value $|p|$ of the amplitude of the second harmonic components Sc12 and Sc22 of the first and second post-computation signals Sc1 and Sc2 not only when the absolute value PH5 of the phase difference between the ideal component of the first signal S1 and the ideal component of the second signal S2 and the absolute value PH6 of the phase difference between the ideal component of the third signal S3 and the ideal component of the fourth signal S4 are both 180° but as long as PH5 and PH6 are both greater than 150° and smaller than 210°. In this manner, the fifth computing circuit 75 generates, based on the first and second post-computation signals Sc1 and Sc2, the fifth post-computation signal Sc5 with the second harmonic component reduced as compared with the first and second post-computation signals Sc1 and Sc2.

In the third embodiment, the sixth post-computation signal Sc6 is generated by computation including determining the difference between the third post-computation signal Sc3 and the fourth post-computation signal Sc4. Determining the difference between the third post-computation signal Sc3 and the fourth post-computation signal Sc4 allows the ideal component Sc61 and the second harmonic component Sc62 of the sixth post-computation signal Sc6 to be expressed by the following Equations (18A) and (18B), respectively. Note that since the third harmonic component Sc33 of the third post-computation signal Sc3 and the third harmonic component Sc43 of the fourth post-computation signal Sc4 are both zero, the sixth post-computation signal Sc6 contains no third harmonic component.

$$Sc61 = Sc31 - Sc41 \quad (18A)$$
$$= 1.73\sin(\theta + \pi/6) - \{-173\sin(\theta + \pi/6)\}$$
$$= 3.46\sin(\theta + \pi/6)$$

$$Sc62 = Sc32 - Sc42 \quad (18B)$$
$$= p \cdot \sin(2\theta + \pi/3) - p \cdot \sin(2\theta + \pi/3)$$
$$= 0$$

As can be seen from Equation (18B), in the third embodiment, the second harmonic component Sc32 of the third post-computation signal Sc8 and the second harmonic component Sc42 of the fourth post-computation signal Sc4 cancel each other out completely when the sixth post-computation signal Sc6 is generated. Thus, the second harmonic component Sc62 of the sixth post-computation signal Sc6 is zero. As is the case with the fifth post-computation signal Sc5, the absolute value of the amplitude of the second harmonic component Sc62 of the sixth post-computation signal Sc6 is smaller than the absolute value $|p|$ of the amplitude of the second harmonic components Sc32 and Sc42 of the third and fourth post-computation signals Sc3 and Sc4 not only when PH6 and the absolute value PH7 of the phase difference between the ideal component of the fifth signal S5 and the ideal component of the sixth signal S6 are both 180° but as long as PH6 and PH7 are both greater than 150° and smaller than 210°. In this manner, the sixth computing circuit 76 generates, based on the third and fourth post-computation signals Sc3 and Sc4, the sixth post-computation signal Sc6 with the second harmonic component reduced as compared with the third and fourth post-computation signals Sc3 and Sc4.

A method for determining the detected angle value θs in the third embodiment will now be described briefly. The seventh computing circuit 77 has the same configuration as the sixth computing circuit 66 of the first embodiment shown in FIG. 4. From Equations (17A) and (17B), the fifth post-computation signal Sc5 equals 3.46 sin(θ−π/6). This is the same as the fourth post-computation signal Sa4 obtained from Equations (4A) and (4B) in the first embodiment. Further, from Equations (18A) and (18B), the sixth post-computation signal Sc6 equals 3.46 sin(θ+π/6). This is the same as the fifth post-computation signal Sa5 obtained from Equations (5A) and (5B) in the first embodiment. Therefore, the description of the method for determining the detected angle value θs in the first embodiment serves as the description of the method for determining the detected angle value θs in the third embodiment if the fourth and fifth post-computation signals Sa4 and Sa5 are replaced with the fifth and sixth post-computation signals Sc5 and Sc6, respectively.

As has been described, in the third embodiment, generated are the first post-computation signal Sc1 with the third harmonic component reduced as compared with the first and third signals S1 and S3, the second post-computation signal Sc2 with the third harmonic component reduced as compared with the second and fourth signals S2 and S4, the third post-computation signal Sc3 with the third harmonic component reduced as compared with the third and fifth signals S3 and S5, and the fourth post-computation signal Sc4 with the third harmonic component reduced as compared with the fourth and sixth signals S4 and S6. Based on the first and second post-computation signals Sc1 and Sc2, generated is the fifth post-computation signal Sc5 with the second harmonic component reduced as compared with the first and second post-computation signals Sc1 and Sc2. Based on the third and fourth post-computation signals Sc3 and Sc4, generated is the sixth post-computation signal Sc6 with the second harmonic component reduced as compared with the third and fourth post-computation signals Sc3 and Sc4. Based on the fifth and sixth post-computation signals Sc5 and Sc6, the detected angle value θs is determined. The third embodiment thereby makes it possible to reduce an error in the detected angle value θs caused by the second and third harmonic components.

The other configuration, operation, and effects of the third embodiment are the same as those of the first embodiment.

Fourth Embodiment

Figure 12:
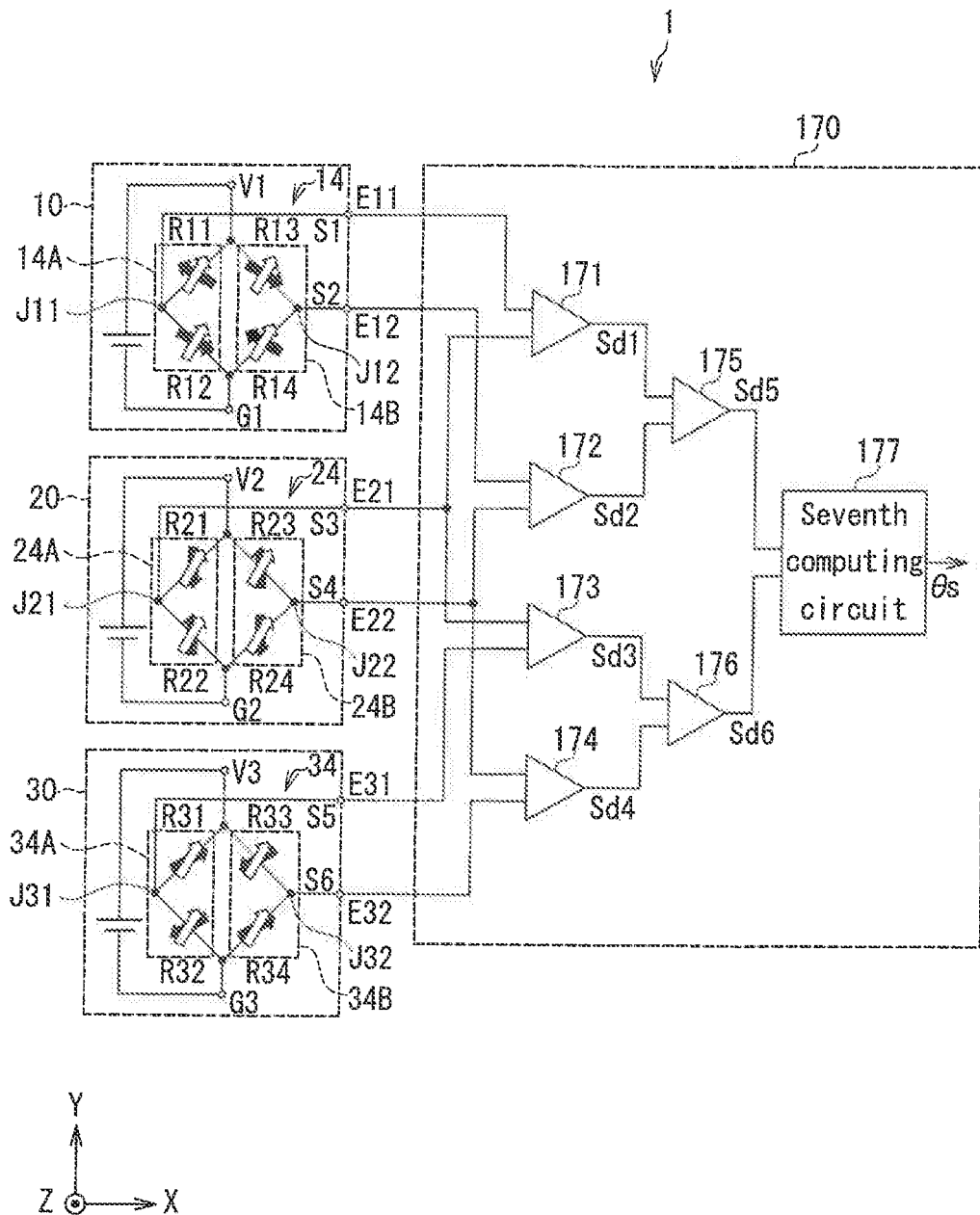
FIG. 12 is a circuit diagram illustrating the configuration of a rotating field sensor according to a fourth embodiment of the invention.

A rotating field sensor according to a fourth embodiment of the invention will now be described with reference to FIG. 12. FIG. 12 is a circuit diagram illustrating the configuration of the rotating field sensor according to the fourth embodiment. In the fourth embodiment, the first to third detection circuits 10, 20 and 30 of the rotating field sensor 1 are configured in the same manner as the second embodiment. The rotating field sensor 1 according to the fourth embodiment includes an angle detection unit 170 in place of the angle detection unit 70 of the third embodiment. Like the angle detection unit 70, the angle detection unit 170 is configured to generate a detected angle value θs based on the first to sixth signals S1 to S6, the detected angle value θs having a correspondence relationship with the angle θ that the direction DM of the rotating magnetic field MF in the reference position PR forms with respect to the reference direction DR. As shown in FIG. 12, the angle detection unit 170 includes a first computing circuit 171, a second computing circuit 172, a third computing circuit 173, a fourth computing circuit 174, a fifth computing circuit 175, a sixth computing circuit 176, and a seventh computing circuit 177.

Each of the first to seventh computing circuits 171 to 177 has two inputs and an output. The first to fourth computing circuits 171 to 174 are connected to the first to third detection circuits 10, 20 and 30 in the same connecting relationship as that of the first to fourth computing circuits 71 to 74 with the first to third detection circuits 10, 20 and 30 in the third embodiment. The first to fourth computing circuits 171 to 174 are connected to the fifth and sixth computing circuits 175 and 176 in the same connecting relationship as that of the first to fourth computing circuits 71 to 74 with the fifth and sixth computing circuits 75 and 76 in the third embodiment. The fifth and sixth computing circuits 175 and 176 are connected to the seventh computing circuit 177 in the same connecting relationship as that of the fifth and sixth computing circuits 75 and 70 with the seventh computing circuit 77 in the third embodiment.

The first computing circuit 171 receives the first and third signals S1 and S3 and generates a first post-computation signal Sd1 based on the first and third signals S1 and S3. The second computing circuit 172 receives the second and fourth signals S2 and S4 and generates a second post-computation signal Sd2 based on the second and fourth signals S2 and S4. The third computing circuit 173 receives the third and fifth signals S3 and S5 and generates a third post-computation signal Sd3 based on the third and fifth signals S3 and S5. The fourth computing circuit 174 receives the fourth and sixth signals S4 and S6 and generates a fourth post-computation signal Sd4 based on the fourth and sixth signals S4 and S6. The fifth computing circuit 175 receives the first and second post-computation signals Sd1 and Sd2 and generates a fifth post-computation signal Sd5 based on the first and second post-computation signals Sd1 and Sd2. The sixth computing circuit 176 receives the third and fourth post-computation signals Sd3 and Sd4 and generates a sixth post-computation signal Sd6 based on the third and fourth post-computation signals Sd3 and Sd4. The seventh computing circuit 177 receives the fifth and sixth post-computation signals Sd5 and Sd6 and determines the detected angle value θs based on the fifth and sixth post-computation signals Sd5 and Sd6.

The first to seventh computing circuits 171 to 177 can be implemented by a single microcomputer, for example.

A method for determining the detected angle value θs in the fourth embodiment will now be described. To begin with, how to generate the first to fourth post-computation signals Sd1 to Sd4 will be described. The ideal components, the second harmonic components, and the third harmonic components of the first to sixth signals S1 to S6 in the fourth embodiment are the same as those in the second embodiment. In the fourth embodiment, the first post-computation signal Sd1 is generated by computation including determining the difference (S1−S3) between the first signal S1 and the third signal S3. Determining the difference (S1−S3) between the first signal S1 and the third signal S3 allows the ideal component Sd11, the second harmonic component Sd12, and the third harmonic component Sd13 of the first post-computation signal Sd1 to be expressed by the following Equations (19A), (19B), and (19C), respectively.

$$Sd11 = \sin(\theta - 2\pi/3) - \sin\theta \qquad (19A)$$
$$= 2\sin(-\pi/3)\cdot\cos(\theta - \pi/3)$$
$$= -1.73\cos(\theta - \pi/3)$$

$$Sd12 = p\cdot\sin(2\theta - 4\pi/3) - p\cdot\sin 2\theta \qquad (19B)$$
$$= 2p\cdot\sin(-2\pi/3)\cdot\cos(2\theta - 2\pi/3)$$
$$= -1.73p\cdot\cos(2\theta - 2\pi/3)$$

$$Sd13 = q\cdot\sin 3\theta - q\cdot\sin 3\theta \qquad (19C)$$
$$= 0$$

As can be seen from Equation (19C), in the fourth embodiment, the third harmonic component of the first signal S1 and the third harmonic component of the third signal S3 cancel each other out completely when the first post-computation signal Sd1 is generated. Thus, the third harmonic component Sd13 of the first post-computation signal Sd1 is zero. As in the second embodiment, the absolute value of the amplitude of the third harmonic component Sd13 of the first post-computation signal Sd1 is smaller than the absolute value |q| of the amplitude of the third harmonic components of the first and third signals S1 and S3 not only when PH1 is 120° but as long as PH1 is greater than 100° and smaller than 140°. In this manner, the first computing circuit 171 generates, based on the first and third signals S1 and S3, the first post-computation signal Sd1 with the third harmonic component reduced as compared with the first and third signals S1 and S3.

In the fourth embodiment, the second post-computation signal Sd2 is generated by computation including determining the difference (S2−S4) between the second signal S2 and the fourth signal S4. Determining the difference (S2−S4) between the second signal S2 and the fourth signal S4 allows the ideal component Sd21, the second harmonic component Sd22, and the third harmonic component Sd23 of the second post-computation signal Sd2 to be expressed by the following Equations (20A), (20B), and (20C), respectively.

$$Sd21 = -\sin(\theta - 2\pi/3) - \{-\sin\theta\} \qquad (20A)$$
$$= -2\sin(-\pi/3)\cdot\cos(\theta - \pi/3)$$
$$= 1.73\cos(\theta - \pi/3)$$

$$Sd22 = p\cdot\sin(2\theta - 4\pi/3) - p\cdot\sin 2\theta \qquad (20B)$$
$$= 2p\cdot\sin(-2\pi/3)\cdot\cos(2\theta - 2\pi/3)$$
$$= -1.73p\cdot\cos(2\theta - 2\pi/3)$$

$$Sd23 = -q\cdot\sin 3\theta - (-q\cdot\sin 3\theta) \qquad (20C)$$
$$= 0$$

As can be seen from Equation (20C), in the fourth embodiment, the third harmonic component of the second signal S2 and the third harmonic component of the fourth signal S4 cancel each other out completely when the second post-computation signal Sd2 is generated. Thus, the third harmonic component Sd23 of the second post-computation signal Sd2 is zero. As in the second embodiment, the absolute value of the amplitude of the third harmonic component Sd23 of the second post-computation signal Sd2 is smaller than the absolute value |q| of the amplitude of the third harmonic components of the second and fourth signals S2 and S4 not only when PH3 is 120° but as long as PH3 is greater than 100° and smaller than 140°. In this manner, the second computing circuit 172 generates, based on the second and fourth signals S2 and S4, the second post-computation signal Sd2 with the third harmonic component reduced as compared with the second and fourth signals S2 and S4.

In the fourth embodiment, the third post-computation signal Sd3 is generated by computation including determining the difference (S3−S5) between the third signal S8 and the fifth signal S5. Determining the difference (S3−S5) between the third signal S3 and the fifth signal S5 allows the ideal component Sd31, the second harmonic component Sd32, and the third harmonic component Sd33 of the third post-computation signal Sd3 to be expressed by the following Equations (21A), (21B), and (21C), respectively.

$$Sd31 = \sin\theta - \sin(\theta + 2\pi/3) \qquad (21A)$$
$$= 2\sin(-\pi/3)\cdot\cos(\theta + \pi/3)$$
$$= -1.73\cos(\theta + \pi/3)$$

$$Sd32 = p\cdot\sin 2\theta - p\cdot\sin(2\theta + 4\pi/3) \qquad (21B)$$
$$= 2p\cdot\sin(-2\pi/3)\cdot\cos(2\theta + 2\pi/3)$$
$$= -1.73p\cdot\cos(2\theta + 2\pi/3)$$

$$Sd33 = q\cdot\sin 3\theta - q\cdot\sin 3\theta \qquad (21C)$$
$$= 0$$

As can be seen from Equation (21C), in the fourth embodiment, the third harmonic component of the third signal S3 and the third harmonic component of the fifth signal S5 cancel each other out completely when the third post-computation signal Sd3 is generated. Thus, the third harmonic component Sd33 of the third post-computation signal Sd3 is zero. As in the second embodiment, the absolute value of the amplitude of the third harmonic component Sd33 of the third post-computation signal Sd3 is smaller than the absolute value |q| of the amplitude of the third harmonic components of the third and fifth signals S8 and S5 not only when PH2 is 120° but as long as PH2 is greater than 100° and smaller than 140°. In this manner, the third computing circuit 173 generates, based on the third and fifth signals S3 and S5, the third post-computation signal Sd3 with the third harmonic component reduced as compared with the third and fifth signals S3 and S5.

In the fourth embodiment, the fourth post-computation signal Sd4 is generated by computation including determining the difference (S4−S6) between the fourth signal S4 and the sixth signal S6. Determining the difference (S4−S6) between the fourth signal S4 and the sixth signal S6 allows the ideal component Sd41, the second harmonic component Sd42, and the third harmonic component Sd43 of the fourth post-computation signal Sd4 to be expressed by the following Equations (22A), (22B), and (22C), respectively.

$$Sd41 = -\sin\theta - \{-\sin(\theta + 2\pi/3)\} \qquad (22A)$$
$$= -2\sin(-\pi/3)\cdot\cos(\theta + \pi/3)$$
$$= 1.73\cos(\theta + \pi/3)$$

$$Sd42 = p\cdot\sin 2\theta - p\cdot\sin(2\theta + 4\pi/3) \qquad (22B)$$
$$= 2p\cdot\sin(-2\pi/3)\cdot\cos(2\theta + 2\pi/3)$$
$$= -1.73p\cdot\cos(2\theta + 2\pi/3)$$

$$Sd43 = -q\cdot\sin 3\theta - (-q\cdot\sin 3\theta) \qquad (22C)$$
$$= 0$$

As can be seen from Equation (22C), in the fourth embodiment, the third harmonic component of the fourth signal S4 and the third harmonic component of the sixth signal S6 cancel each other out completely when the fourth post-computation signal Sd4 is generated. Thus, the third harmonic component Sd43 of the fourth post-computation signal Sd4 is zero. As in the second embodiment, the absolute value of the amplitude of the third harmonic component Sd43 of the fourth post-computation signal Sd4 is smaller than the absolute value |q| of the amplitude of the third harmonic components of the fourth and sixth signals S4 and S6 not only when PH4 is 120° but as long as PH4 is greater than 100° and smaller than 140°. In this manner, the fourth computing circuit 174 generates, based on the fourth and sixth signals S4 and S6, the fourth post-computation signal Sd4 with the third harmonic component reduced as compared with the fourth and sixth signals S4 and S6.

Next, how to generate the fifth and sixth post-computation signals Sd5 and Sd6 will be described. The fifth and sixth post-computation signals Sd5 and Sd6 are generated basically in the same manner as the fifth and sixth post-computation signals Sc5 and Sc6 in the third embodiment. More specifically, a computation similar to Equation (17A) of the third embodiment determines that the ideal component Sd51 of the fifth post-computation signal Sd5 equals $-3.46 \cos(\theta-\pi/3)$. A computation similar to Equation (17B) of the third embodiment determines that the second harmonic component Sd52 of the fifth post-computation signal Sd5 is zero. A computation similar to Equation (18A) of the third embodiment determines that the ideal component Sd61 of the sixth post-computation signal Sd6 equals $-3.46 \cos(\theta+\pi/3)$. A computation similar to Equation (18B) of the third embodiment determines that the second harmonic component Sd62 of the sixth post-computation signal Sd6 is zero.

Note that the absolute value of the amplitude of the second harmonic component Sd52 of the fifth post-computation signal Sd5 is smaller than the absolute value |1.73p| of the amplitude of the second harmonic components Sd12 and Sd22 of the first and second post-computation signals Sd1 and Sd2 not only when the absolute value PH5 of the phase difference between the ideal component of the first signal S1 and the ideal component of the second signal S2 and the absolute value PH6 of the phase difference between the ideal component of the third signal S3 and the ideal component of the fourth signal S4 are both 180° but as long as PH5 and PH6 are both greater than 150° and smaller than 210°. In this manner, the fifth computing circuit 175 generates, based on the first and second post-computation signals Sd1 and Sd2, the fifth post-computation signal Sd5 with the second harmonic component reduced as compared with the first and second post-computation signals Sd1 and Sd2.

Further, the absolute value of the amplitude of the second harmonic component Sd62 of the sixth post-computation signal Sd6 is smaller than the absolute value |1.73p| of the amplitude of the second harmonic components Sd32 and Sd42 of the third and fourth post-computation signals Sd3 and Sd4 not only when PH6 and the absolute value PH7 of the phase difference between the ideal component of the fifth signal S5 and the ideal component of the sixth signal S6 are both 180° but as long as PH6 and PH7 are both greater than 150° and smaller than 210°. In this manner, the sixth computing circuit 176 generates, based on the third and fourth post-computation signals Sd3 and Sd4, the sixth post-computation signal Sd6 with the second harmonic component reduced as compared with the third and fourth post-computation signals Sd3 and Sd4.

How the seventh computing circuit 177 determines the detected angle value θs will now be described briefly. The fifth post-computation signal Sd5 equals $-3.46 \cos(\theta-\pi/3)$, which is the same as the fourth post-computation signal Sb4 obtained from Equations (9A) and (9B) in the second embodiment. The sixth post-computation signal Sd6 equals $-3.46 \cos(\theta+\pi/3)$, which is the same as the fifth post-computation signal Sb5 obtained from Equations (10A) and (10B) in the second embodiment. Therefore, the description of the method for determining the detected angle value θs in the second embodiment serves as the description of the method for determining the detected angle value θs in the fourth embodiment if the fourth and fifth post-computation signals Sb4 and Sb5 are replaced with the fifth and sixth post-computation signals Sd5 and Sd6, respectively.

The other configuration, operation, and effects of the fourth embodiment are the same as those of the second or third embodiment.

Fifth Embodiment

Figure 13:
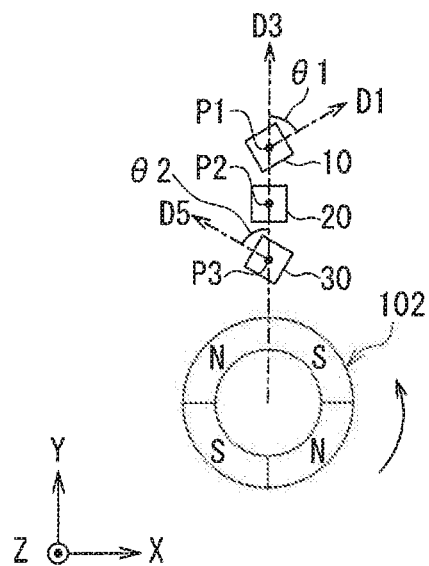
FIG. 13 is an explanatory diagram illustrating the configuration of a rotating field sensor according to a fifth embodiment of the invention.

A rotating field sensor according to a fifth embodiment of the invention will now be described with reference to FIG. 13. FIG. 13 is an explanatory diagram illustrating the configuration of the rotating field sensor according to the fifth embodiment. In FIG. 13, a magnet 102 including one or more pairs of N and S poles alternately arranged in a ring shape is shown as an example of the means for generating a rotating magnetic field whose direction rotates. In the example shown in FIG. 13, the magnet 102 includes two pairs of N and S poles. The rotating field sensor 1 according to the fifth embodiment detects the direction of the rotating magnetic field generated from the outer periphery of the magnet 102. In the example shown in FIG. 13, the plane of the drawing of FIG. 13 is an XY plane, and a direction perpendicular to the plane is the Z direction. The N and S poles of the magnet 102 are arranged symmetrically with respect to the center of rotation parallel to the Z direction. The magnet 102 rotates about the center of rotation. As a result, a rotating magnetic field occurs based on the magnetic field generated by the magnet 102. The rotating magnetic field rotates about the center of rotation (the Z direction). In the example shown in FIG. 13, the magnet 102 rotates in a counterclockwise direction, and the rotating magnetic field rotates in a clockwise direction.

In the fifth embodiment, the first position P1 where the first detection circuit 10 detects the rotating magnetic field, the second position P2 where the second detection circuit 20 detects the rotating magnetic field, and the third position P3 where the third detection circuit 30 detects the rotating magnetic field are the same in the direction of rotation of the magnet 102. Thus, in the fifth embodiment the first to third detection circuits 10, 20 and 30 are located in the same position in the direction of rotation of the magnet 102.

In the example shown in FIG. 13, the third direction D3, which is a direction of the rotating magnetic field that maximizes the third signal S3 generated by the third signal generation unit 24A (see FIG. 3) of the second detection circuit 20, is set in a radial direction of the magnet 102. The first direction D1, which is a direction of the rotating magnetic field that maximizes the first signal S1 generated by the first signal generation unit 14A (see FIG. 3) of the first detection circuit 10, is the direction rotated clockwise by θ1 from the third direction D3 in the XY plane. The fifth direction D5, which is a direction of the rotating magnetic field that maximizes the fifth signal S5 generated by the fifth signal generation unit 34A (see FIG. 3) of the third detection circuit 30, is the direction rotated counterclockwise by θ2 from the third direction D3 in the XY plane. Both θ1 and θ2 are greater than 40° and smaller than 80°. Both θ1 and θ2 are preferably 60° as shown in FIG. 13.

The rotating field sensor 1 shown in FIG. 13 is otherwise configured in the same manner as the first or third embodiment.

MODIFICATION EXAMPLES

Figure 14:
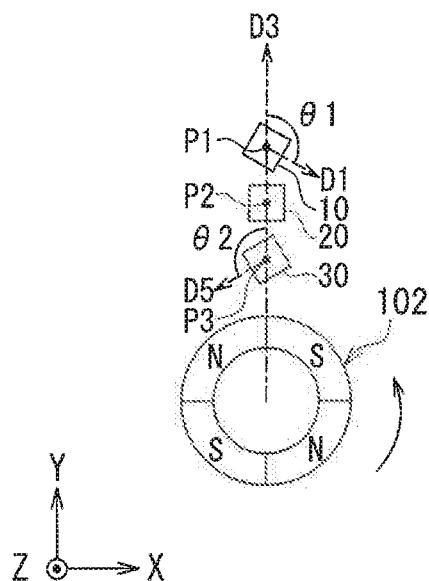
FIG. 14 is an explanatory diagram illustrating the configuration of a rotating field sensor of a first modification example of the fifth embodiment of the invention.

A first, a second and a third modification example of the fifth embodiment will now be described with reference to FIG. 14 to FIG. 16. Reference is first made to FIG. 14 to describe the first modification example of the fifth embodiment. FIG. 14 is an explanatory diagram illustrating the configuration of a rotating field sensor of the first modification example of the fifth embodiment. The configuration of the rotating field sensor 1 of the first modification example is basically the same as that of the rotating field sensor shown in FIG. 13. In the first modification example, both θ1 and θ2 are greater than 100° and smaller than 140°. Both θ1 and θ2 are preferably 120° as shown in FIG. 14. The rotating field sensor 1 shown in FIG. 14 is otherwise configured in the same manner as the second or fourth embodiment.

Next, the second modification example of the fifth embodiment will be described with reference to FIG. 15. FIG. 15 is an explanatory diagram illustrating the configuration of a rotating field sensor of the second modification example of the fifth embodiment. In FIG. 15, a magnet 103 including a plurality of pairs of N and S poles alternately arranged in a linear configuration is shown as an example of the means for generating a rotating magnetic field whose direction rotates. The rotating field sensor 1 of the second modification example detects the direction of the rotating magnetic field generated from the outer periphery of the magnet 103. In the example shown in FIG. 15, the plane of the drawing of FIG. 15 is the XY plane, and a direction perpendicular to the plane is the Z direction. The magnet 103 moves linearly in its longitudinal direction in response to a linear movement of an object. As a result, a rotating magnetic field occurs based on the magnetic field generated by the magnet 103. The rotating magnetic field rotates about the Z direction.

Figure 15:
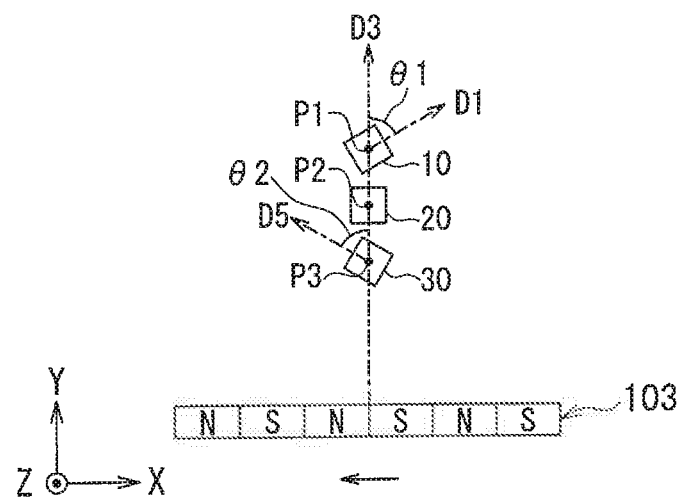
FIG. 15 is an explanatory diagram illustrating the configuration of a rotating field sensor of a second modification example of the fifth embodiment of the invention.
Figure 16:
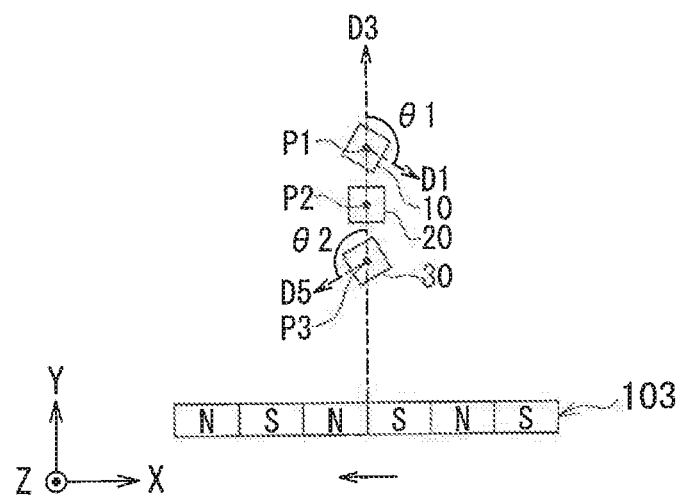
FIG. 16 is an explanatory diagram illustrating the configuration of a rotating field sensor of a third modification example of the fifth embodiment of the invention.

In the example shown in FIG. 15, the third direction D3 is set in a direction orthogonal to the direction of movement of the magnet 103 in the XY plane. The first direction D1 is the direction rotated clockwise by θ1 from the third direction D3 in the XY plane. The fifth direction D5 is the direction rotated counterclockwise by θ2 from the third direction D3 in the XY plane. In the second modification example, both θ1 and θ2 are greater than 40° and smaller than 80°. Both θ1 and θ2 are preferably 60° as shown in FIG. 15. The rotating field sensor 1 shown in FIG. 15 is otherwise configured in the same manner as the rotating field sensor 1 shown in FIG. 13.

Next, the third modification example of the fifth embodiment will be described with reference to FIG. 16. FIG. 16 is an explanatory diagram illustrating the configuration of a rotating field sensor of the third modification example of the fifth embodiment. The configuration of the rotating field sensor 1 of the third modification example is basically the same as that of the rotating field sensor 1 shown in FIG. 15. In the third modification example, both θ1 and θ2 are greater than 100° and smaller than 140°. Both θ1 and θ2 are preferably 120° as shown in FIG. 16. The rotating field sensor 1 shown in FIG. 16 is otherwise configured in the same manner as the rotating field sensor 1 of the first modification example shown in FIG. 14.

For the sake of convenience, in FIG. 13 to FIG. 16 the first to third detection circuits 10, 20 and 30 are depicted as being spaced from each other in the Y direction. However, the locations of the first to third detection circuits 10, 20 and 30 in the Y direction are preferably close to each other, and more preferably identical with each other.

The other configuration, operation, and effects of the fifth embodiment are the same as those of any of the first to fourth embodiments.

Sixth Embodiment

Figure 17:
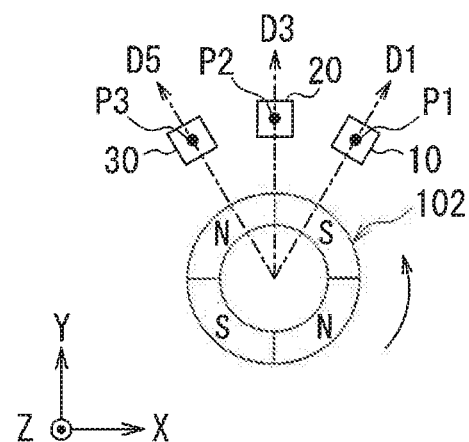
FIG. 17 is an explanatory diagram illustrating the configuration of a rotating field sensor according to a sixth embodiment of the invention.

A rotating field sensor according to a sixth embodiment of the invention will now be described with reference to FIG. 17. FIG. 17 is an explanatory diagram illustrating the configuration of the rotating field sensor according to the sixth embodiment. The rotating field sensor 1 according to the sixth embodiment detects the direction of a rotating magnetic field generated from the outer periphery of the magnet 102, as in the examples of the fifth embodiment shown in FIG. 13 and FIG. 14. The rotating field sensor 1 according to the sixth embodiment is configured so that the first position P1 where the first detection circuit 10 detects the rotating magnetic field, the second position P2 where the second detection circuit 20 detects the rotating magnetic field, and the third position P3 where the third detection circuit 30 detects the rotating magnetic field are different from each other in the direction of rotation of the magnet 102. More specifically, in the sixth embodiment, the first to third detection circuits 10, 20 and 30 are located at different positions in the direction of rotation of the magnet 102. The difference between the first position P1 and the second position P2 is equivalent to the absolute value PH1 of the phase difference between the ideal component of the first signal S1 and the ideal component of the third signal S3. The difference between the second position P2 and the third position P8 is equivalent to the absolute value PH2 of the phase difference between the ideal component of the third signal S3 and the ideal component of the fifth signal S5. The difference between the first position P1 and the third position P3 is equivalent to PH1+PH2.

In the example shown in FIG. 17, the magnet 102 includes two pairs of N and S poles. The rotating magnetic field makes two rotations during one rotation of the magnet 102. In this case, one period of the first to sixth detection signals S1 to S6, i.e., an electrical angle of 360°, is equivalent to a one-half rotation of the magnet 102, i.e., a 180-degree angle of rotation of the magnet 102. PH1 and PH2 are both greater than 40° and smaller than 80°. PH1 and PH2 are both preferably 60°. FIG. 17 shows an example in which PH1 and PH2 are both 60°. In this example, the difference between the first position P1 and the second position P2 and the difference between the second position P2 and the third position P3 are both 60° in electrical angle, i.e., 30° in the angle of rotation of the magnet 102. Further, the difference between the first position P1 and the third position P3 is 120° in electrical angle, i.e., 60° in the angle of rotation of the magnet 102.

In the example shown in FIG. 17, the first direction D1 which is a direction of the rotating magnetic field that maximizes the first signal S1 generated by the first signal generation unit 14A (see FIG. 3) of the first detection circuit 10, the third direction D3 which is a direction of the rotating magnetic field that maximizes the third signal S3 generated by the third signal generation unit 24A (see FIG. 3) of the second detection circuit 20, and the fifth direction D5 which is a direction of the rotating magnetic field that maximizes the fifth signal S6 generated by the fifth signal generation unit 34A (see FIG. 3) of the third detection circuit 30 are all set in radial directions of the magnet 102. The rotating field sensor 1 shown in FIG. 17 is otherwise configured in the same manner as the first or third embodiment.

MODIFICATION EXAMPLES

Figure 18:
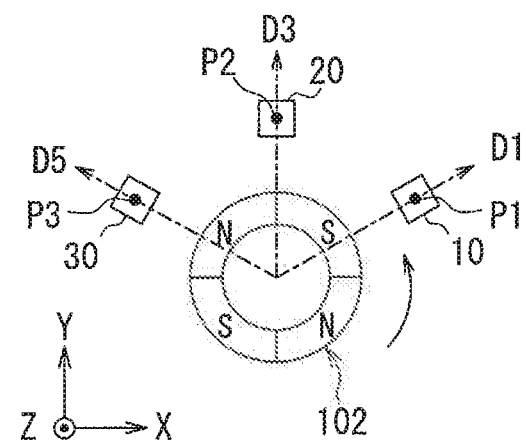
FIG. 18 is an explanatory diagram illustrating the configuration of a rotating field sensor of a first modification example of the sixth embodiment of the invention.

A first, a second and a third modification example of the sixth embodiment will now be described with reference to FIG. 18 to FIG. 20. Reference is first made to FIG. 18 to describe the first modification example of the sixth embodiment. FIG. 18 is an explanatory diagram illustrating the configuration of a rotating field sensor of the first modification example of the sixth embodiment. The configuration of the rotating field sensor 1 of the first modification example is basically the same as that of the rotating field sensor shown in FIG. 17. In the first modification example, PH1 and PH2 are both greater than 100° and smaller than 140°. PH1 and PH2 are both preferably 120°. FIG. 18 shows an example in which PH1 and PH2 are both 120°. In this example, the difference between the first position P1 and the second position P2 and the difference between the second position P2 and the third position P3 are both 120° in electrical angle, i.e., 60° in the angle of rotation of the magnet 102. Further, the difference between the first position P1 and the third position P3 is 240° in electrical angle, i.e., 120° in the angle of rotation of the magnet 102. The rotating field sensor 1 shown in FIG. 18 is otherwise configured in the same manner as the second or fourth embodiment.

Next, the second modification example of the sixth embodiment will be described with reference to FIG. 19. FIG. 19 is an explanatory diagram illustrating the configuration of a rotating field sensor of the second modification example of the sixth embodiment. The rotating field sensor 1 of the second modification example detects the direction of a rotating magnetic field generated from the outer periphery of the magnet 103, as in the example of the fifth embodiment shown in FIG. 15 and FIG. 16. In the example shown in FIG. 19, the rotating magnetic field makes one rotation while the magnet 103 moves by one pitch, i.e., as much as a pair of N and S poles. In this case, one period of the first to sixth signals S1 to S6, i.e., 360° in electrical angle, is equivalent to one pitch of the magnet 103. In the second modification example, the difference between the first position P1 and the second position P2 is equivalent to PH1, the difference between the second position P2 and the third position P3 is equivalent to PH2, and both PH1 and PH2 are greater than 40° and smaller than 80°. PH1 and PH2 are both preferably 60°. FIG. 19 shows an example in which PH1 and PH2 are both 60°. In this example, the difference between the first position P1 and the second position P2 and the difference between the second position P2 and the third position P3 are both ⅙ pitch. Further, the difference between the first position P1 and the third position P3 is ⅓ pitch.

Figure 19:
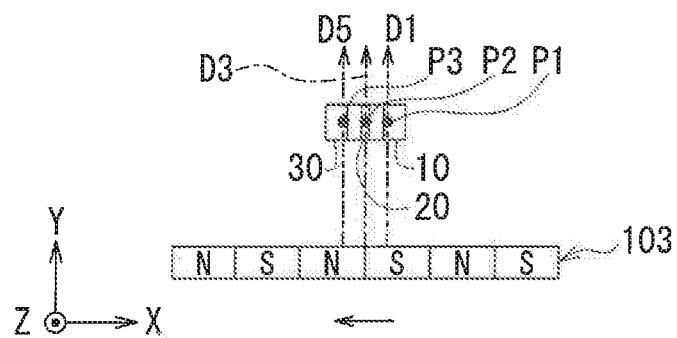
FIG. 19 is an explanatory diagram illustrating the configuration of a rotating field sensor of a second modification example of the sixth embodiment of the invention.

In the example shown in FIG. 19, the first, third and fifth directions D1, D3 and D5 are all set in a direction orthogonal to the direction of movement of the magnet 103 in the XY plane. The rotating field sensor 1 shown in FIG. 19 is otherwise configured in the same manner as the rotating field sensor 1 shown in FIG. 17.

Next, the third modification example of the sixth embodiment will be described with reference to FIG. 20. FIG. 20 is an explanatory diagram illustrating the configuration of a rotating field sensor of the third modification example of the sixth embodiment. The configuration of the rotating field sensor 1 of the third modification example is basically the same as that of the rotating field sensor shown in FIG. 19. In the third modification example, PH1 and PH2 are both greater than 100° and smaller than 140°. PH1 and PH2 are both preferably 120°. FIG. 20 shows an example in which PH1 and PH2 are both 120°. In this example, the difference between the first position P1 and the second position P2 and the difference between the second position P2 and the third position P3 are both ⅓ pitch. Further, the difference between the first position P1 and the third position P3 is ⅔ pitch.

Figure 20:
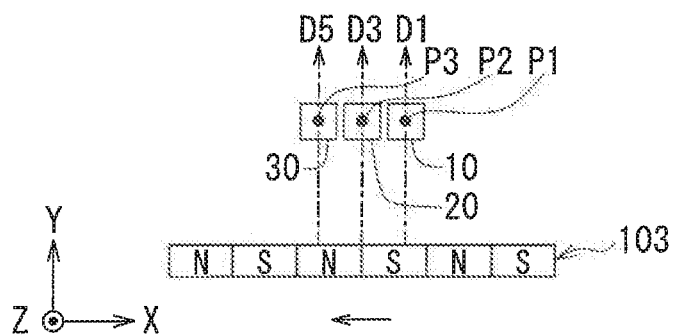
FIG. 20 is an explanatory diagram illustrating the configuration of a rotating field sensor of a third modification example of the sixth embodiment of the invention.

In the example shown in FIG. 20, the first, third and fifth directions D1, D3 and D5 are all set in a direction orthogonal to the direction of movement of the magnet 103 in the XY plane. The rotating field sensor 1 shown in FIG. 20 is otherwise configured in the same manner as the rotating field sensor 1 of the first modification example shown in FIG. 18.

The other configuration, operation, and effects of the sixth embodiment are the same as those of any of the first to fifth embodiments.

The present invention is not limited to the foregoing embodiments, and various modifications may be made thereto. For example, the arrangement of the first to third detection circuits 10, 20 and 30 and the first to sixth directions D1 to D6 in the foregoing embodiments are illustrative only. Various modifications may be made to the arrangement of the first to third detection circuits 10, 20 and 30 and the first to sixth directions D1 to D6 within the scope of the requirements set forth in the claims.

It is apparent that the present invention can be carried out in various forms and modifications in the light of the foregoing descriptions. Accordingly, within the scope of the following claims and equivalents thereof the present invention can be carried out in forms other than the foregoing most preferable embodiments.

What is claimed is:

1. A rotating field sensor configured to detect an angle that a direction of a rotating magnetic field in a reference position forms with respect to a reference direction, the rotating field sensor comprising:

first to sixth signal generators configured to generate first to sixth signals, respectively, each of the first to sixth signals being responsive to the direction of the rotating magnetic field, each of the first to sixth signal generators including at least one magnetic detection element; and an angle detector configured to generate a detected angle value based on the first to sixth signals, the detected angle value having a correspondence relationship with the angle that the direction of the rotating magnetic field in the reference position forms with respect to the reference direction, wherein each of the first to sixth signals contains: an ideal component that varies periodically with a predetermined signal period; a first error component of a period of ½ the predetermined signal period; and a second error component of a period of ⅓ the predetermined signal period, the ideal components of the first to sixth signals are different in phase from each other, an absolute value of a phase difference between the ideal component of the first signal and the ideal component of the second signal, an absolute value of a phase difference between the ideal component of the third signal and the ideal component of the fourth signal, and an absolute value of a phase difference between the ideal component of the fifth signal and the ideal component of the sixth signal are all greater than 150° and smaller than 210°, and the angle detector includes:
- a first computing circuit configured to generate, based on the first and third signals, a first post-computation signal in which the second error component of the period of ⅓ the predetermined signal period is reduced as compared with the first and third signals;
- a second computing circuit configured to generate, based on the second and fourth signals, a second post-computation signal in which the second error component of the period of ⅓ the predetermined signal period is reduced as compared with the second and fourth signals;
- a third computing circuit configured to generate, based on the third and fifth signals, a third post-computation signal in which the second error component of the period of ⅓ the predetermined signal period is reduced as compared with the third and fifth signals;
- a fourth computing circuit configured to generate, based on the fourth and sixth signals, a fourth post-computation signal in which the second error component of the period of ⅓ the predetermined signal period is reduced as compared with the fourth and sixth signals;
- a fifth computing circuit configured to generate, based on the first and second post-computation signals, a fifth post-computation signal in which the first error component of the period of ½ the predetermined signal period is reduced as compared with the first and second post-computation signals;
- a sixth computing circuit configured to generate, based on the third and fourth post-computation signals, a sixth post-computation signal in which the first error component of the period of ½ the predetermined signal period is reduced as compared with the third and fourth post-computation signals; and
- a seventh computing circuit configured to determine the detected angle value based on the fifth and sixth post-computation signals.

2. The rotating field sensor according to claim 1, wherein PH1, PH2, PH3, and PH4 are all greater than 40° and smaller than 80°, an absolute value of a phase difference between the ideal component of the first signal and the ideal component of the fifth signal is PH1+PH2, and an absolute value of a phase difference between the ideal component of the second signal and the ideal component of the sixth signal is PH3+PH4, where PH1 represents an absolute value of a phase difference between the ideal component of the first signal and the ideal component of the third signal, PH2 represents an absolute value of a phase difference between the ideal component of the third signal and the ideal component of the fifth signal, PH3 represents an absolute value of a phase difference between the ideal component of the second signal and the ideal component of the fourth signal, and PH4 represents an absolute value of a phase difference between the ideal component of the fourth signal and the ideal component of the sixth signal, the first post-computation signal is generated by computation including determining a sum of the first signal and the third signal, the second post-computation signal is generated by computation including determining a sum of the second signal and the fourth signal, the third post-computation signal is generated by computation including determining a sum of the third signal and the fifth signal, the fourth post-computation signal is generated by computation including determining a sum of the fourth signal and the sixth signal, the fifth post-computation signal is generated by computation including determining a difference between the first post-computation signal and the second post-computation signal, and the sixth post-computation signal is generated by computation including determining a difference between the third post-computation signal and the fourth post-computation signal.

3. The rotating field sensor according to claim 1, wherein PH1, PH2, PH3, and PH4 are all greater than 100° and smaller than 140°, an absolute value of a phase difference between the ideal component of the first signal and the ideal component of the fifth signal is PH1+PH2, and an absolute value of a phase difference between the ideal component of the second signal and the ideal component of the sixth signal is PH3+PH4, where PH1 represents an absolute value of a phase difference between the ideal component of the first signal and the ideal component of the third signal, PH2 represents an absolute value of a phase difference between the ideal component of the third signal and the ideal component of the fifth signal, PH3 represents an absolute value of a phase difference between the ideal component of the second signal and the ideal component of the fourth signal, and PH4 represents an absolute value of a phase difference between the ideal component of the fourth signal and the ideal component of the sixth signal, the first post-computation signal is generated by computation including determining a difference between the first signal and the third signal, the second post-computation signal is generated by computation including determining a difference between the second signal and the fourth signal, the third post-computation signal is generated by computation including determining a difference between the third signal and the fifth signal, the fourth post-computation signal is generated by computation including determining a difference between the fourth signal and the sixth signal, the fifth post-computation signal is generated by computation including determining a difference between the first post-computation signal and the second post-computation signal, and the sixth post-computation signal is generated by computation including determining a difference between the third post-computation signal and the fourth post-computation signal.

4. The rotating field sensor according to claim 1, wherein the at least one magnetic detection element is at least one magnetoresistive element including: a magnetization pinned layer whose magnetization direction is pinned; a free layer whose magnetization direction varies depending on the direction of the rotating magnetic field; and a nonmagnetic layer disposed between the magnetization pinned layer and the free layer.

5. The rotating field sensor according to claim 1, wherein each of the first to sixth signal generators includes, as the at least one magnetic detection element, a first magnetoresistive element and a second magnetoresistive element connected in series, each of the first and second magnetoresistive elements includes: a magnetization pinned layer whose magnetization direction is pinned; a free layer whose magnetization direction varies depending on the direction of the rotating magnetic field; and a nonmagnetic layer disposed between the magnetization pinned layer and the free layer, the magnetization direction of the magnetization pinned layer of the first magnetoresistive element and the magnetization direction of the magnetization pinned layer of the second magnetoresistive element are opposite to each other, the first and second magnetoresistive elements are configured so that a predetermined voltage is applied between an end of the first magnetoresistive element and an end of the second magnetoresistive element farther from each other, and each of the first to sixth signals is output from a junction between the first and second magnetoresistive elements in a corresponding one of the first to sixth signal generators.

* * * * *